(12) United States Patent
Joo et al.

(10) Patent No.: US 9,651,577 B2
(45) Date of Patent: May 16, 2017

(54) POGO PIN AND PROBE CARD, AND METHOD OF MANUFACTURING A SEMICONDUCTOR DEVICE USING THE SAME

(71) Applicant: Samsung Electronics Co., Ltd., Suwon-si (KR)

(72) Inventors: Sung-Ho Joo, Seoul (KR); Yu-Kyum Kim, Hwaseong-si (KR); Joon-Yeon Kim, Yongin-Si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 201 days.

(21) Appl. No.: 14/472,449

(22) Filed: Aug. 29, 2014

(65) Prior Publication Data
US 2015/0070038 A1    Mar. 12, 2015

(30) Foreign Application Priority Data

Sep. 10, 2013 (KR) .................. 10-2013-0108191

(51) Int. Cl.
*G01R 31/20* (2006.01)
*G01R 1/073* (2006.01)
*G01R 1/067* (2006.01)

(52) U.S. Cl.
CPC ..... *G01R 1/07378* (2013.01); *G01R 1/07371* (2013.01); *G01R 1/06722* (2013.01)

(58) Field of Classification Search
CPC ............ G01R 31/2889; G01R 1/07342; G01R 1/06727; G01R 31/31905; G01R 1/06722; G01R 1/06772; G01R 1/07314; G01R 31/2886; G01R 31/31926; G01R 1/07385; G01R 31/2863; G01R 31/318555; G01R 1/0408; G01R 31/31903; G01R 31/2887; H04M 1/05; H04M 1/6058; H04M 1/0262; H04M 1/0274; H04M 1/0277; H04M 1/6066; H04M 2250/02; H04R 1/1058; H01R 13/64; H01R 43/26; H01R 12/7052; H01R 43/205; H04L 12/2697
See application file for complete search history.

(56) References Cited

U.S. PATENT DOCUMENTS

| 5,434,513 | A | * | 7/1995 | Fujii | G01R 1/07378 324/754.07 |
| 5,641,315 | A | | 6/1997 | Swart et al. | |
| 5,973,504 | A | * | 10/1999 | Chong | G01R 1/0735 324/754.07 |
| 5,974,662 | A | | 11/1999 | Eldridge et al. | |
| 6,392,866 | B1 | | 5/2002 | Dinteman | |

(Continued)

*Primary Examiner* — Vinh Nguyen
(74) *Attorney, Agent, or Firm* — Muir Patent Law, PLLC

(57) ABSTRACT

A pogo pin may include a housing, a resilient connecting member and a switching unit. The housing may be arranged between a printed circuit board (PCB) and a probing head. The resilient connecting member may be arranged in the housing to electrically connect the PCB with the probing head. The switching unit may be provided in the housing to selectively cut off an electrical connection between the PCB and the probing head. Thus, because the PCB may not require additional switching substrates, the PCB may have a small size so that the probe card may also have a small size. A semiconductor device may be manufactured using the probe card.

15 Claims, 20 Drawing Sheets

(56) References Cited

U.S. PATENT DOCUMENTS

| | | | |
|---|---|---|---|
| 6,794,887 B1 * | 9/2004 | Nelson | G01R 31/2887 324/754.07 |
| 6,842,029 B2 * | 1/2005 | Howland | G01R 31/2886 324/750.25 |
| 7,233,156 B2 | 6/2007 | Yanagisawa et al. | |
| 7,245,134 B2 | 7/2007 | Granicher et al. | |
| 7,495,464 B2 | 2/2009 | Miyazaki et al. | |
| 7,656,175 B2 | 2/2010 | Fukushima et al. | |
| 7,772,864 B2 | 8/2010 | Nagata | |
| 7,969,170 B2 | 6/2011 | Kazama | |
| 8,062,078 B2 | 11/2011 | Asai et al. | |
| 8,138,778 B1 | 3/2012 | Smith | |
| 8,149,008 B2 | 4/2012 | Yamada et al. | |
| 8,217,674 B2 | 7/2012 | Amaro et al. | |
| 2011/0128025 A1 | 6/2011 | Kazama et al. | |
| 2012/0019277 A1 | 1/2012 | Kazama et al. | |
| 2012/0229159 A1 | 9/2012 | Kim et al. | |
| 2013/0099814 A1 | 4/2013 | Kazama et al. | |
| 2013/0106459 A1 | 5/2013 | Tseng et al. | |

\* cited by examiner

POGO PIN AND PROBE CARD, AND METHOD OF MANUFACTURING A SEMICONDUCTOR DEVICE USING THE SAME

CROSS-RELATED APPLICATION

This application claims priority under 35 USC §119 to Korean Patent Application No. 10-2013-0108191, filed on Sep. 10, 2013 in the Korean Intellectual Property Office (KIPO), the contents of which are herein incorporated by reference in their entirety.

BACKGROUND

1. Field

This disclosure relates to a pogo pin and a probe card including the same. More particularly, this disclosure relates to a pogo pin configured to electrically connect a printed circuit board (PCB) with a probing head, a probe card including the pogo pin, and a method of manufacturing a semiconductor device using the probe card.

2. Description of the Related Art

Generally, a probe card may be used for testing a semiconductor substrate. The probe card may include a printed circuit board (PCB) having a circuit pattern, a probing head having a test pattern, a plurality of pogo pins configured to electrically connect the PCB with the probing head, and a plurality of needles installed at the probing head and configured to make contact with an object, such as a semiconductor chip.

The pogo pins may include springs or spring-like mechanisms that cause the contact between the plurality of needles and the object being tested to be less stressing on the object. According to related art, the probe card may further include switching circuits attached to the PCB. The switching circuits, which may be part of a substrate or other physical object added to the PCB or included within the PCB, may selectively block a test current flowing through the circuit pattern of the PCB to control the test current to the needles.

However, the amount of the switching circuits may be the same as that of the needles. Thus, the PCB may have a large size for allowing the switching circuit to be arranged in the PCB. As a result, the large PCB may act as to increase a size of the probe card.

Further, the PCB may include conductive lines electrically connected between the switching circuits and the circuit pattern. Thus, the PCB may have a very complicated structure. The PCB having the complicated structure may be relatively expensive.

Particularly, because the switching circuits may be far away from the object being tested, noise may be generated in the test current supplied to the needles.

SUMMARY

Example embodiments provide a pogo pin having switching functions.

Example embodiments also provide a probe card including the above-mentioned pogo pin.

Example embodiments additionally include a method of manufacturing a semiconductor device using a probe card.

According to example embodiments, a probe card is disclosed. The probe card includes: a printed circuit board (PCB) having a circuit pattern through which a test current passes; a probing head arranged under the PCB, the probing head including circuitry through which the test current passes; a plurality of needles provided to the probing head to supply the test current to an object; and a plurality of pogo pins positioned between the PCB and the probing head. Each pogo pin includes a housing arranged between the PCB and the probing head, a resilient connecting member arranged in the housing to electrically connect the PCB with the probing head, and a switching unit provided in the housing to selectively cut off an electrical connection between the PCB and the probing head.

In certain embodiments, each pogo pin includes: a first connecting pin at a first end of the resilient connecting member; and a second connecting pin at a second, opposite end of the resilient connecting member. The switching unit electrically disconnects the first connecting pin from the second connecting pin.

In certain embodiments, the switching unit includes an actuator connected to a disconnecting member, the actuator configured to move the disconnecting member so as to electrically disconnect the first connecting pin from the second connecting pin.

The resilient connecting member may include at least a first spring. The switching unit may be configured to electrically disconnect the first spring from one of the first connecting pin and the second connecting pin.

In one embodiment, the switching unit includes: either an insulating plate that electrically disconnects the first spring from one of the first connecting pin and the second connecting pin when placed between the first spring and the first or second connecting pin or a bar that physically moves the first spring to separate it from one of the first connecting pin and the second connecting pin.

According to certain exemplary embodiments, a pogo pin is connected to a printed circuit board (PCB) and a probing head of a probe card and positioned to pass signals between circuitry of the PCB and circuitry of the probing head. The pogo pin includes: housing arranged between the PCB and the probing head; at least a first spring arranged to electrically connect and disconnect the PCB and the probing head; at least a first connecting pin between the first spring and the PCB; at least a second connecting pin between the first spring and the probing head; and an actuator and disconnecting element arranged to selectively electrically connect and disconnect one of the first pin and the second pin from the first spring.

In one embodiment, the disconnecting member includes one of a raising/lowering element to raise and lower the first spring, and an insulating member that electrically disconnects the first pin or second pin from the first spring.

According to example embodiments, there may be provided a pogo pin. The pogo pin may include a housing, a resilient connecting member and a switching unit. The housing may be arranged between a printed circuit board (PCB) and a probing head. The resilient connecting member may be arranged in the housing to electrically connect the PCB with the probing head. The switching unit may be provided in the housing to selectively cut off an electrical connection between the PCB and the probing head.

In example embodiments, the resilient connecting member may include a first spring electrically connected to the PCB. The resilient connecting member may also include a second spring electrically connected to the probing head.

In example embodiments, the first spring and the second spring may include a tensile spring.

In example embodiments, the switching unit may include an insulating plate selectively interposed between the first spring and the second spring, and an actuator configured to selectively move the insulating plate between the first spring and the second spring.

In example embodiments, the first spring and the second spring may include a compressive spring.

In example embodiments, the switching unit may include a switching rod connected to the first spring, and an actuator configured to move the switching rod to contact the first spring with the second spring.

In example embodiments, the resilient connecting member may include a tensile spring.

In example embodiments, the switching unit may include a switching rod connected to the resilient connecting member, and an actuator configured to move the switching rod to cut off a connection between the resilient connecting member and the PCB.

In example embodiments, the resilient connecting member may include a compressive spring.

In example embodiments, the switching unit may include a switching rod connected to the resilient connecting member, and an actuator configured to move the switching rod to connect the resilient connecting member with the PCB.

In example embodiments, the pogo pin may further include a first connecting pin interposed between the housing and the PCB to electrically connect the resilient connecting member with the PCB, and a second connecting pin interposed between the housing and the probing head to electrically connect the resilient connecting member with the probing head.

In example embodiments, the switching unit may include an insulating plate selectively interposed between the first connecting pin and the PCB, and an actuator configured to move the insulating plate between the first connecting pin and the PCB.

In example embodiments, the switching unit may include an insulating plate selectively interposed between the second connecting pin and the probing head, and an actuator configured to selectively move the insulating plate between the second connecting pin and the probing head.

In example embodiments, the resilient connecting member comprises at least a first spring and a second spring extending between the PCB and the probing head; and the switching unit comprises an actuator and a disconnecting member, configured to selectively electrically disconnect the first spring from the second spring, wherein the disconnecting member either vertically moves one of the first spring and the second spring, or electrically insulates the first spring from the second spring.

According to further embodiments, a method of manufacturing a semiconductor device includes: providing at least a first semiconductor chip; performing testing of the first semiconductor chip using a probe card, the testing including: controlling a plurality of actuators to electrically connect or disconnect pogo pins of a probe card to or from one of a printed circuit board (PCB) of the probe card or a probing head of a probe card, selectively sending test signals to the first semiconductor chip, based on the controlled actuators, and determining that the first semiconductor chip passes the testing. The method additionally includes, as a result of passing the testing, providing the tested first semiconductor chip in a semiconductor package.

BRIEF DESCRIPTION OF THE DRAWINGS

Example embodiments will be more clearly understood from the following detailed description taken in conjunction with the accompanying drawings.

FIGS. 1 and 2 are cross-sectional views illustrating a pogo pin in accordance with example embodiments;

FIGS. 3 and 4 are cross-sectional views illustrating a pogo pin in accordance with example embodiments;

FIGS. 5 and 6 are cross-sectional views illustrating a pogo pin in accordance with example embodiments;

FIGS. 7 and 8 are cross-sectional views illustrating a pogo pin in accordance with example embodiments;

FIGS. 9 and 10 are cross-sectional views illustrating a pogo pin in accordance with example embodiments;

FIGS. 11 and 12 are cross-sectional views illustrating a pogo pin in accordance with example embodiments;

FIGS. 13 and 14 are cross-sectional views illustrating a pogo pin in accordance with example embodiments;

FIGS. 15 and 16 are cross-sectional views illustrating a pogo pin in accordance with example embodiments;

FIGS. 17 and 18 are cross-sectional views illustrating a pogo pin in accordance with example embodiments;

FIGS. 19 and 20 are cross-sectional views illustrating a pogo pin in accordance with example embodiments;

FIGS. 21 and 22 are cross-sectional views illustrating a pogo pin in accordance with example embodiments;

FIGS. 23 and 24 are cross-sectional views illustrating a pogo pin in accordance with example embodiments;

FIGS. 25 and 26 are cross-sectional views illustrating a pogo pin in accordance with example embodiments;

FIGS. 27 and 28 are cross-sectional views illustrating a pogo pin in accordance with example embodiments;

FIGS. 29 and 30 are cross-sectional views illustrating a pogo pin in accordance with example embodiments;

FIGS. 31 and 32 are cross-sectional views illustrating a pogo pin in accordance with example embodiments;

FIGS. 33 and 34 are cross-sectional views illustrating a pogo pin in accordance with example embodiments;

FIGS. 35 and 36 are cross-sectional views illustrating a pogo pin in accordance with example embodiments;

FIG. 37 is a cross-sectional view illustrating an exemplary probe card including a pogo pin such as described in FIGS. 1 through 36, according to certain example embodiments.

DETAILED DESCRIPTION

Figure 1:
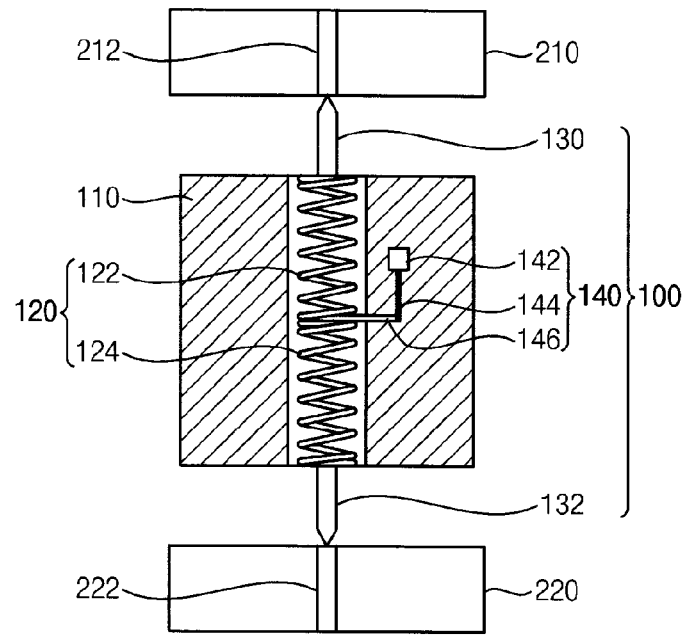
FIGS. 1 to 37 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. The term "contact," however, implies direct contact, unless the context indicates otherwise. Like numerals refer to like elements throughout.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

One aspect of the disclosed embodiments is the use of pogo pins within a probe card for both reducing the stress placed on an object being tested, and for controlling whether a signal passes to a particular element on the object. As described above, traditional pogo pins serve a physical function of reducing stress placed on an object by needles connected to the probe card. They also help ensure that all connection elements (e.g., pads) of an object being tested (e.g., a semiconductor chip) are contacted. In this sense, these pogo pins typically serve a physical purpose only. As described below, the various embodiments include pogo pins that both serve a physical purpose, as well as an electrical signaling purpose (e.g., whether or not to pass a signal).

Pogo Pins

Figure 2:
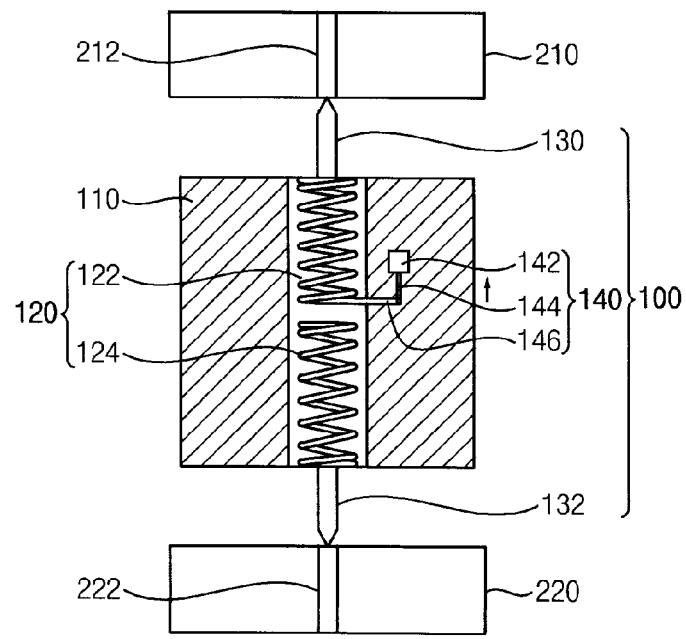

FIGS. 1 and 2 are cross-sectional views illustrating a pogo pin in accordance with example embodiments.

Referring to FIG. 1, a pogo pin 100 of this example embodiment includes a housing 110, a resilient connecting member 120, a first connecting pin 130, a second connecting pin 132 and a switching unit 140.

The housing 110 is arranged between a PCB 210 and a probing head 220 of a probe card. In example embodiments, the housing 110 may have a hollow cylindrical shape. In one embodiment, the housing 110 is formed of an insulating material.

The first connecting pin 130 is arranged at an upper surface of the housing 110. The first connecting pin 130 may have an upper end configured to make contact with a circuit pattern 212 of the PCB, and a lower end connected to the upper surface of the housing 110. In example embodiments, the upper end of the first connecting pin 130 has a sharp shape.

The second connecting pin 132 is arranged on a lower surface of the housing 110. The second connecting pin 132 may have a lower end configured to make contact with a test pattern 222 (e.g., a test circuit) of the probing head 220, and an upper end connected to the lower surface of the housing 110. In example embodiments, the lower end of the second connecting pin 132 has a sharp shape.

The resilient connecting member 120 is positioned in the housing 110. The resilient connecting member 120 may be physically and electrically connected between the first connecting pin 130 and the second connecting pin 132. In example embodiments, the resilient connecting member 120 may include a first portion, such as a first spring 122 and a second portion, such as a second spring 124.

The first spring 122 may be positioned in an upper inner space of the housing 110. The first spring 122 may have an upper end electrically connected to the lower end of the first connecting pin 130. The second spring 124 may be positioned in a lower inner space of the housing 110. The lower end of the second spring 124 may be electrically connected to the upper end of the second connecting pin 132.

In example embodiments, the first spring 122 and the second spring 124 include a tensile spring. Thus, when a force is not applied to the first spring 122 and/or the second spring 124, a lower end of the first spring 122 may be connected to an upper end of the second spring 124.

The switching unit 140 may be provided to the housing 110. Though not shown, the housing may include certain cut-out sections to accommodate the switching unit 140. The switching unit 140 may selectively cut off an electrical connection between the first spring 122 and the second spring 124. In example embodiments, the switching unit 140 may include an actuator 142 and a switching hook (144, 146).

The actuator 142 may be arranged in a sidewall of the housing 110. The switching hook may be a raising/lowering element that may include, for example, a rod 144 (e.g., vertical portion) and a horizontal portion 146 (e.g., a bar or plate or another rod). This element is also referred to generally herein as a disconnecting member. The hook connects the actuator 142 with the lower end of the first spring 122. The actuator may control the location of the horizontal portion 146, to be for example, either up or down. Though not shown, in certain embodiments, the actuator is electrically connected to circuitry that can receive control signals from an external device such as a tester (e.g., a tester computer). As such, a controller in the external device may control the actuator to cause the switching hook to be in different positions. In one embodiment, the actuator 142 may raise the switching hook to upwardly compress the first spring 122, or may lower the switching hook to allow the first spring 122 to connect with the second spring 124. In example embodiments, the actuator 142 may include a motor, a cylinder, etc. Though a hook is described as having two portions (e.g., horizontal and vertical portions), the element including portions 144 and 146 may include fewer or more portions, and may be collectively referred to as a bar herein. For example, it may comprise a raising/lowering bar having one or more portions configured to raise or lower a spring under the control of actuator 142.

Therefore, as shown in FIG. 2, the compressed first spring 122 may be spaced apart from the second spring 124. The PCB 210 may be electrically disconnected from the probing head 220 so that a test current flowing through the circuit pattern 212 of the PCB 210 is cut off by the switching unit 140 in the pogo pin 100. As a result, the test current destined for that pogo pin 100 is not supplied to the probing head 220.

In contrast, when the actuator 142 is stopped, the compressive force on the tensile first spring 122 may be released so that the first spring 122 is returned to an original position. Thus, the first spring 122 may be connected to the second spring 124 so that the test current may be supplied to the probing head 220 through the PCB 210 and the pogo pin 100. Although a first spring 122 and second spring 124 are shown as coiled springs in the figures, different types of resilient devices could be used as a spring, so long as they provide compressive and tensile characteristics and are conductive. For the purposes of this disclosure, first spring 122 may be referred to generally as a first resilient portion, and second spring 124 may be referred to generally as a second resilient portion.

In one embodiment, when the first spring 122 is in its original position, the first spring 122 connects to the second spring 124 directly (e.g., they contact each other). In another embodiment, when the first spring 122 is in its original position, the first spring connects to the second spring 124 through portion 146 of the switching hook. In this embodiment, for example, portion 146 may be electrically conductive, while portion 144 is not electrically conductive.

In the manner described above, the resilient connecting member 120 is used both as a stress-reducing spring that reduces stress applied to a tested object by needles connected to a probe card, and as a switch that controls whether or not a signal passes from the PCB 210 to a respective needle.

Figure 3:
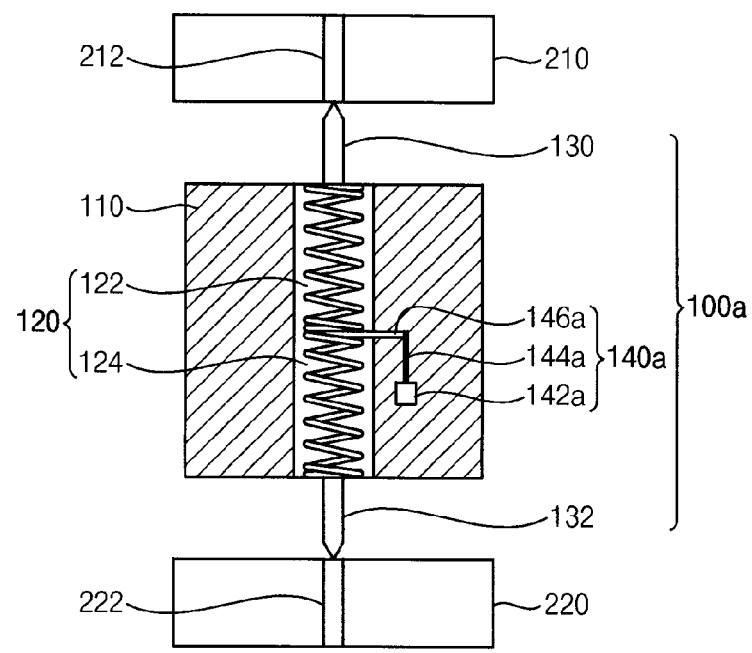
Figure 4:
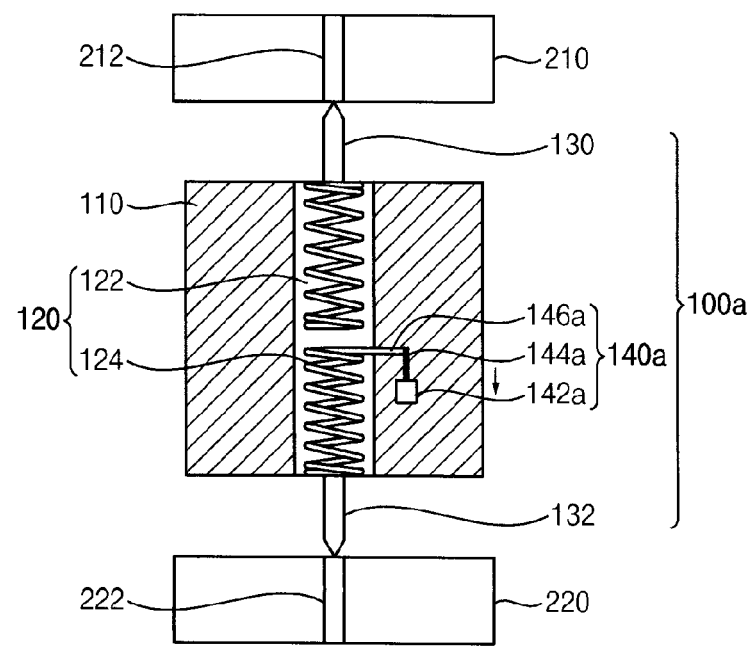

FIGS. 3 and 4 are cross-sectional views illustrating a pogo pin in accordance with example embodiments.

A pogo pin 100a of this example embodiment may include elements substantially the same as those of the pogo pin 100 in FIG. 1 except for a switching unit. Thus, the same reference numerals may refer to the same elements and any further illustrations with respect to the same elements may be omitted herein for brevity. Similarly, the different terminology and details described above in connection with FIGS. 1 and 2 may apply to FIGS. 3 and 4 and later figures, even though they are not repeated below.

Referring to FIG. 3, a switching unit 140a of this example embodiment includes an actuator 142a and a switching bar 144a, 146a. The actuator 142a may be arranged in the sidewall of the housing 110. The switching bar 144a, 146a is connected between the actuator 142a and the upper end of the second spring 124. The actuator 142a may lower the switching bar 144a, 146a to downwardly compress the second spring 124.

Therefore, as shown in FIG. 4, the compressed second spring 124 may be spaced apart from the first spring 122. The PCB 210 may be disconnected from the probing head 220 so that the test current flowing through the circuit pattern 212 of the PCB 210 is cut off by the pogo pin 100a. As a result, the test current is not supplied to the probing head 220.

In contrast, when the actuator 142a is stopped, the tensile second spring 124 may be tensed so that the second spring 124 is returned to an original position. Thus, the second spring 124 may be connected to the first spring 122 so that the test current is supplied to the probing head 220 through the PCB 210 and the pogo pin 100a.

Figure 5:
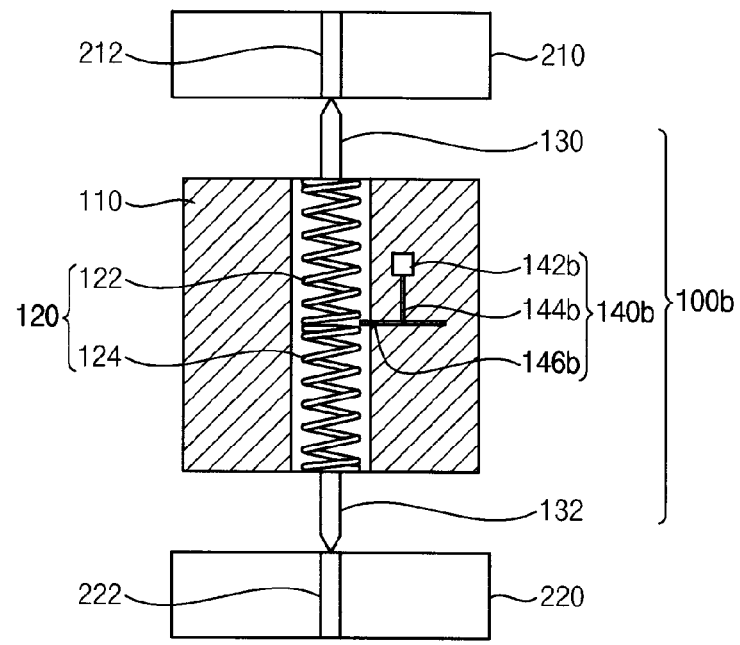
Figure 6:
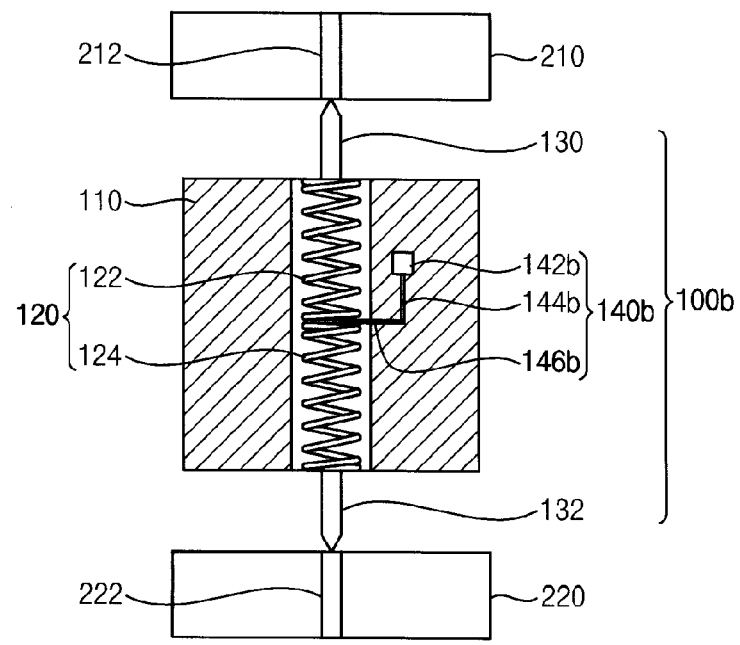

FIGS. 5 and 6 are cross-sectional views illustrating a pogo pin in accordance with example embodiments.

A pogo pin 100b of this example embodiment may include elements substantially the same as those of the pogo pin 100 in FIG. 1 except for a switching unit. Thus, the same reference numerals may refer to the same elements and any further illustrations with respect to the same elements may be omitted herein for brevity.

Referring to FIG. 5, a switching unit 140b of this example embodiment includes an actuator 142b, a switching rod 144b and an insulating plate 146b. The actuator 142b may be arranged in the sidewall of the housing 110. The switching rod 144b may be connected to the actuator 142b. The insulating plate 146b may be connected to the switching rod 144b. The insulating plate 146b may be arranged between the first spring 122 and the second spring 124. In example embodiments, the insulating plate 146b includes an insulating film having a thin thickness.

The actuator 142b may move the switching rod 144b, which causes the insulating plate 146b to be horizontally moved into and out of the housing 110. The insulating plate 146b may then be placed between the first spring 122 and the second spring 124.

Therefore, as shown in FIG. 6, the insulating plate 146b may act to electrically disconnect the first spring 122 from the second spring 124. The PCB 210 may be disconnected from the probing head 220 so that the test current flowing through the circuit pattern 212 of the PCB 210 is cut off by the pogo pin 100b. As a result, the test current is not supplied to the probing head 220.

In contrast, when the actuator 142b is reversely operated, the insulating plate 146b is returned to an original position. Thus, the tensile first spring 122 is electrically connected to the tensile second spring 124 so that the test current may be supplied to the probing head 220 through the PCB 210 and the pogo pin 100b.

Figure 7:
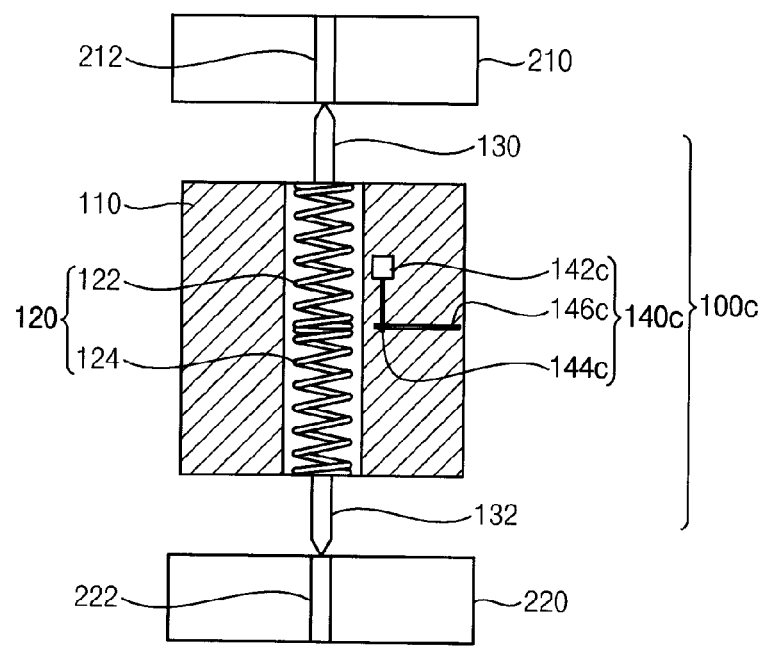
Figure 8:
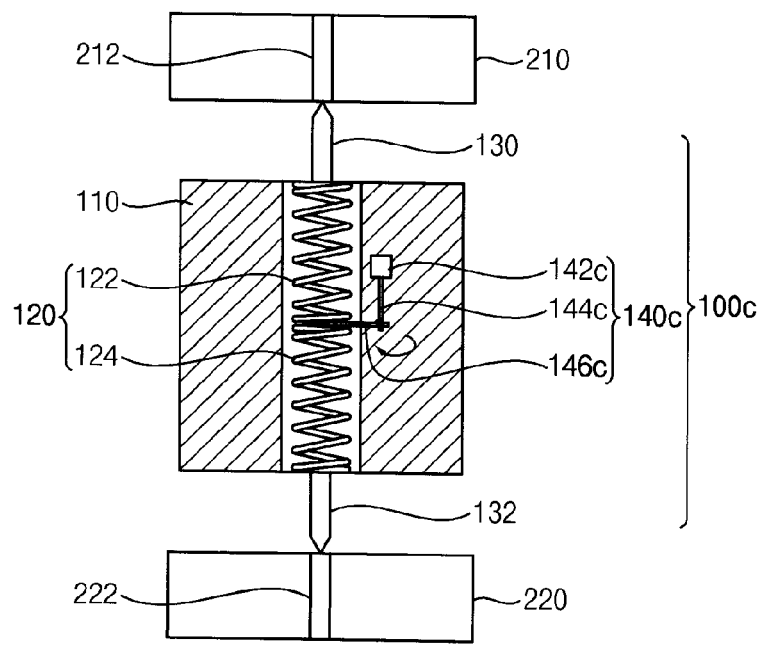

FIGS. 7 and 8 are cross-sectional views illustrating a pogo pin in accordance with example embodiments.

A pogo pin 100c of this example embodiment may include elements substantially the same as those of the pogo pin 100 in FIG. 1 except for a switching unit. Thus, the same reference numerals may refer to the same elements and any further illustrations with respect to the same elements may be omitted herein for brevity.

Referring to FIG. 7, a switching unit 140c of this example embodiment includes an actuator 142c, a switching rod 144c and an insulating plate 146c. The actuator 142c may be arranged in the sidewall of the housing 110. The switching rod 144c may be connected to the actuator 142c. In example embodiments, the switching rod 144c may be connected to an eccentric portion of the insulating plate 146c, in a way that allows the plate to rotate into and out of a position between the first spring 122 and the second spring 124. In some instances, therefore, the insulating plate 146c may be arranged between the first spring 122 and the second spring 124.

The actuator 142c may move the switching rod 144c. The insulating plate 146c may be rotated into the housing 110. The insulating plate 146c may then be placed between the first spring 122 and the second spring 124.

Therefore, as shown in FIG. 8, the insulating plate 146c may act to electrically disconnect the first spring 122 from the second spring 124. The PCB 210 may be disconnected from the probing head 220 so that the test current flowing through the circuit pattern 212 of the PCB 210 is cut off by the pogo pin 100c. As a result, the test current is not supplied to the probing head 220.

In contrast, when the actuator 142c is reversely operated, the insulating plate 146c may be returned to an original position. Thus, the tensile first spring 122 may be electrically connected to the tensile second spring 124 so that the test current is supplied to the probing head 220 through the PCB 210 and the pogo pin 100c.

Figure 9:
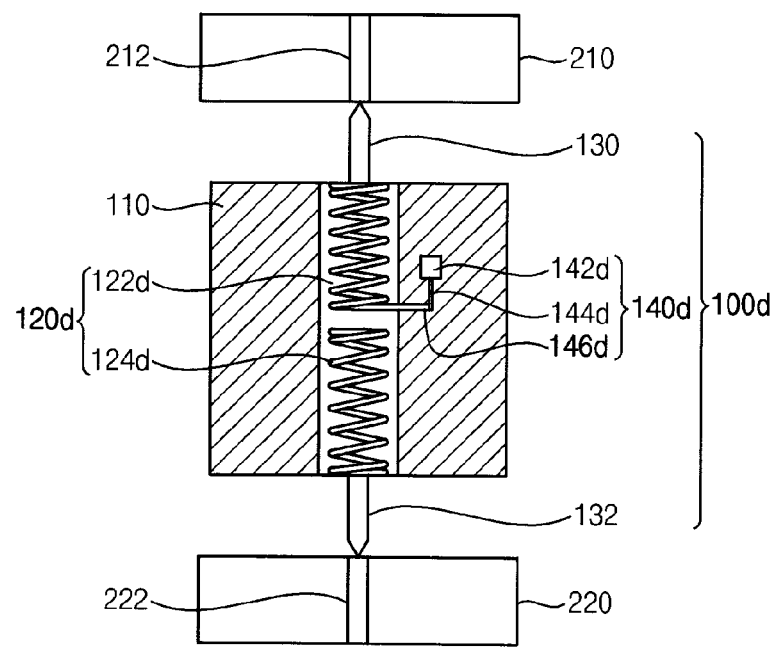
Figure 10:
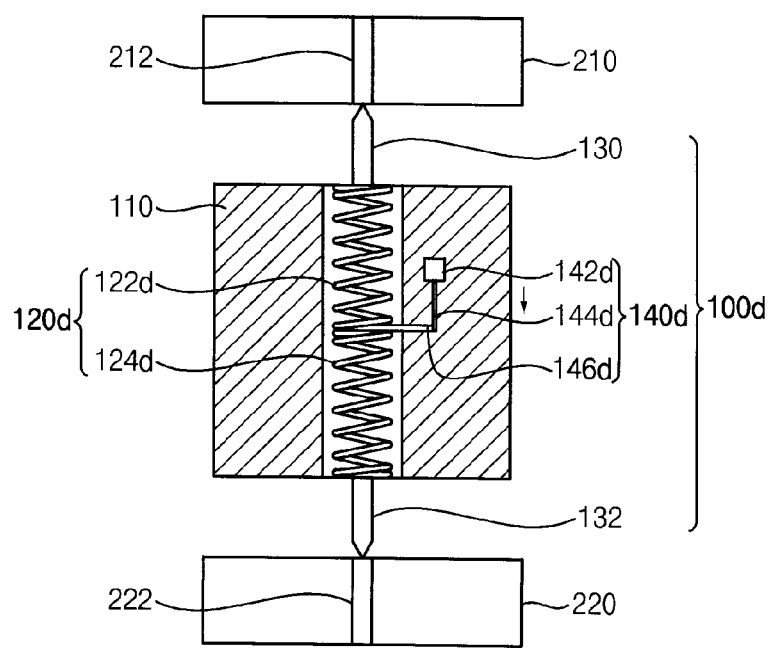

FIGS. 9 and 10 are cross-sectional views illustrating a pogo pin in accordance with example embodiments.

A pogo pin 100d of this example embodiment may include elements substantially the same as those of the pogo pin 100 in FIG. 1 except for a resilient connecting member and a switching unit. Thus, the same reference numerals may refer to the same elements and any further illustrations with respect to the same elements may be omitted herein for brevity.

Referring to FIGS. 9 and 10, a resilient connecting member 120d of this example embodiment may include a first spring 122d and a second spring 124d. The first spring 122d and the second spring 124d may include a compressive spring. Thus, when a force is not applied to the first spring 122d and the second spring 124d, the first spring 122d and the second spring 124d may be disconnected from each other.

A switching unit 140d of this example embodiment includes an actuator 142d and a switching bar 144d, 146d. The switching bar 144d, 146d may be connected a lower end of the first spring 122d. The actuator 142d may lower the switching bar 144d, 146d to downwardly tense the first spring 122d. Therefore, the tensed first spring 122d may be connected to the second spring 124d so that the test current is supplied to the probing head 220 through the PCB 210 and the pogo pin 100d.

In contrast, when the actuator 142d is stopped, the compressive first spring 122d may be compressed and returned to an original position. Thus, the first spring 122d may be disconnected from the second spring 124d so that the test current is not supplied to the probing head 220 from the PCB 210.

Figure 11:
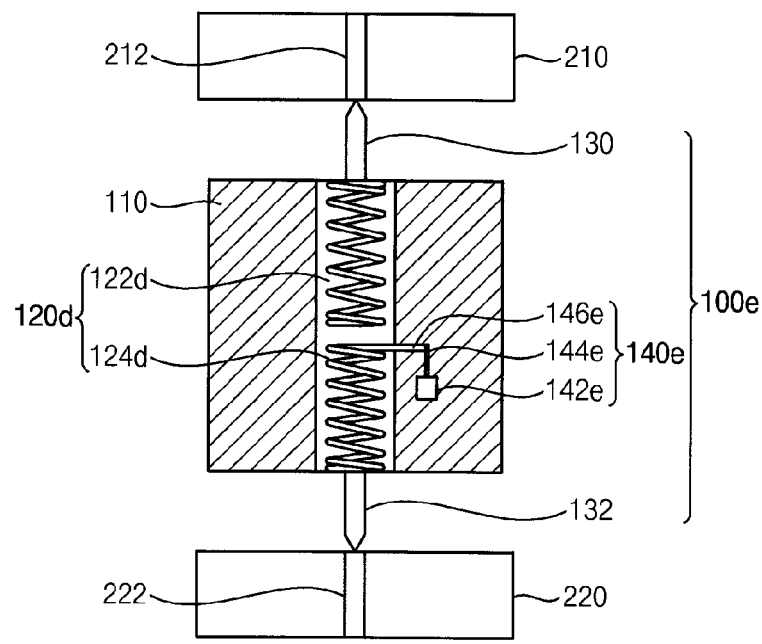
Figure 12:
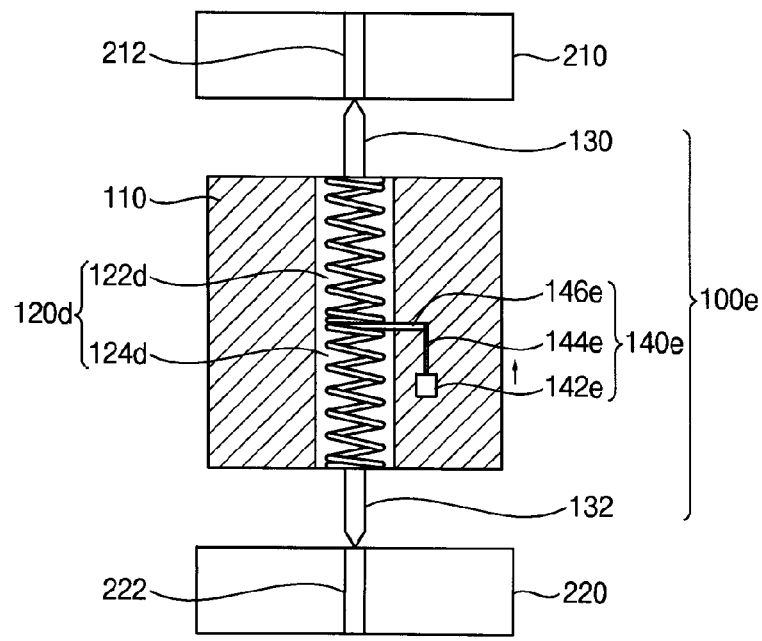

FIGS. 11 and 12 are cross-sectional views illustrating a pogo pin in accordance with example embodiments.

A pogo pin 100e of this example embodiment may include elements substantially the same as those of the pogo pin 100d in FIG. 9 except for a switching unit. Thus, the same reference numerals may refer to the same elements and any further illustrations with respect to the same elements may be omitted herein for brevity.

Referring to FIG. 11, a switching unit 140e of this example embodiment may include an actuator 142e and a switching bar 144e, 146e. The actuator 142e may be arranged in the sidewall of the housing 110. The switching bar 144e, 146e may be connected between the actuator 142e and the upper end of the second spring 124d. The actuator 142e may raise the switching bar 144e, 146e to downwardly tense the second spring 124d.

Therefore, as shown in FIG. 12, the tensed second spring 124d may be connected to the first spring 122d. The PCB 210 may be connected to the probing head 220 so that the test current flowing through the circuit pattern 212 of the PCB 210 is supplied to the probing head 220 through the pogo pin 100e.

In contrast, when the actuator 142e is stopped, the compressive second spring 124d may be compressed and returned to an original position. Thus, the second spring 124d may be disconnected from the first spring 122d so that the test current is not supplied to the probing head 220 from the PCB 210.

Figure 13:
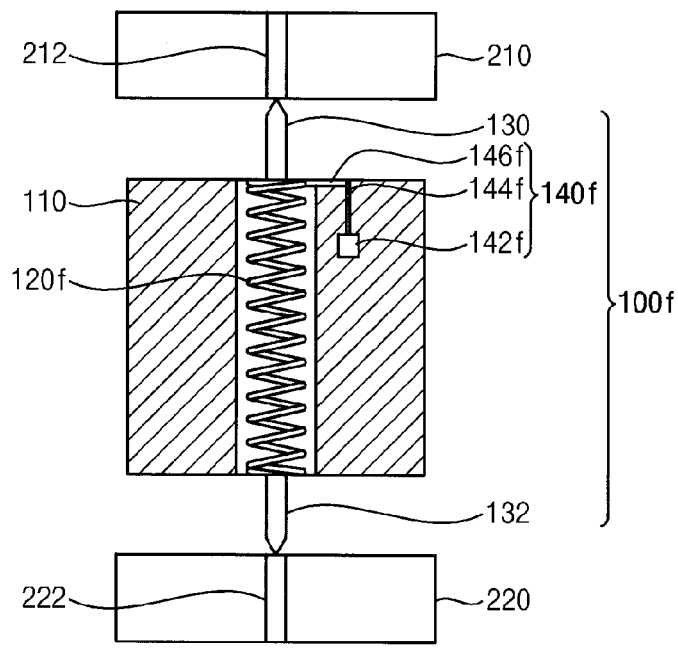
Figure 14:
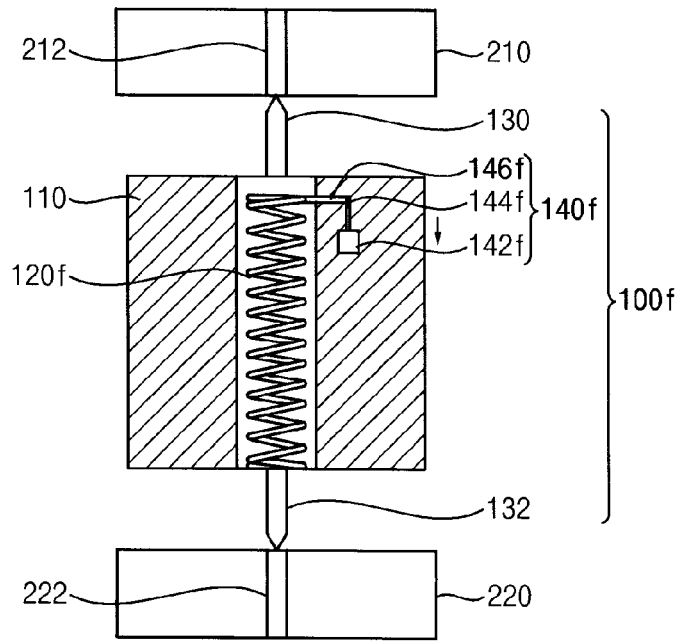

FIGS. 13 and 14 are cross-sectional views illustrating a pogo pin in accordance with example embodiments.

A pogo pin 100f of this example embodiment may include elements substantially the same as those of the pogo pin 100 in FIG. 1 except for a resilient connecting member and a switching unit. Thus, the same reference numerals may refer to the same elements and any further illustrations with respect to the same elements may be omitted herein for brevity.

Referring to FIG. 13, a resilient connecting member 120f of this example embodiment may include a single tensile spring. In example embodiments, the resilient connecting member 120f may have an upper end configured to selectively make contact with the first connecting pin 130, and a lower end fixed to the second connecting pin 132.

A switching unit 140f of this example embodiment may include an actuator 142f and a switching bar 144f, 146f. The switching bar 144f, 146f may be connected to the upper end of the resilient connecting member 120f. The actuator 142f may lower the switching bar 144f, 146f to downwardly compress the resilient connecting member 120f. Therefore, as shown in FIG. 14, the upper end of the resilient connecting member 120f may be disconnected from the first connecting pin 130. As a result, the test current may not be supplied to the probing head 220.

In contrast, when the actuator 142f is stopped, the tensile resilient connecting member 120f may be tensed and returned to an original position. Thus, the upper end of the resilient connecting member 120f may be electrically connected to the first connecting pin 130 so that the test current may be supplied to the probing head 220 through the PCB 210 and the pogo pin 100f.

Figure 15:
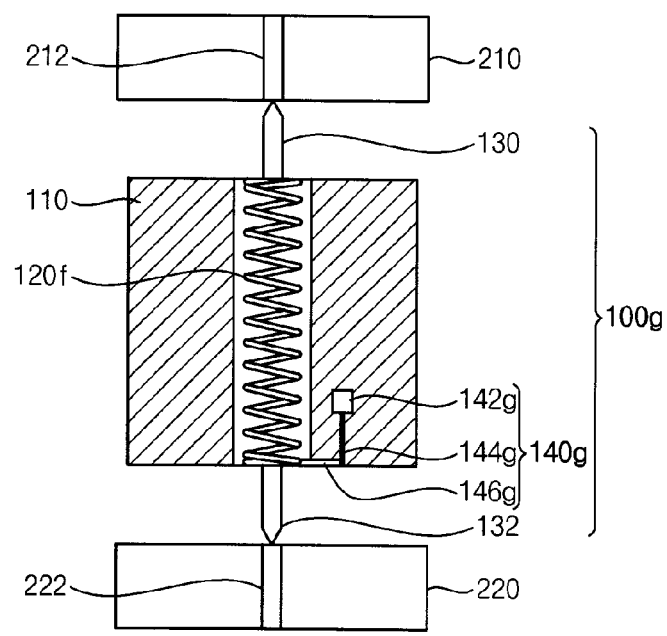
Figure 16:
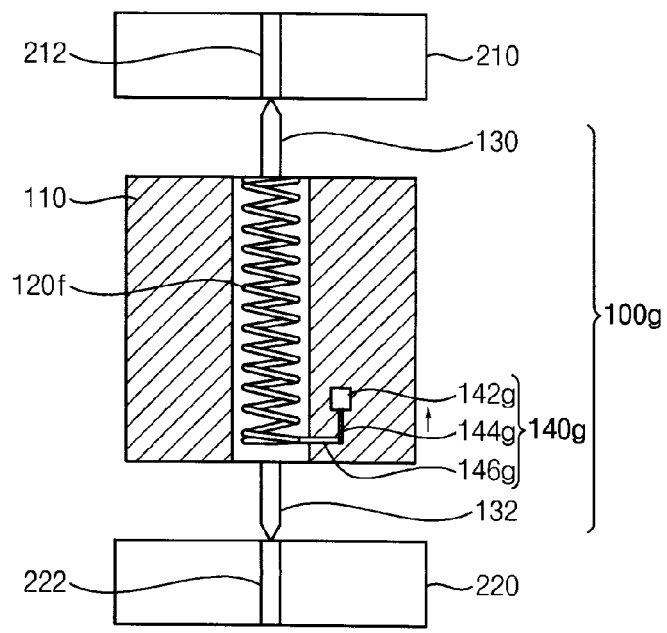

FIGS. 15 and 16 are cross-sectional views illustrating a pogo pin in accordance with example embodiments.

A pogo pin 100g of this example embodiment may include elements substantially the same as those of the pogo pin 100f in FIG. 13 except for a switching unit. Thus, the same reference numerals may refer to the same elements and any further illustrations with respect to the same elements may be omitted herein for brevity.

Referring to FIG. 15, a switching unit 140g of this example embodiment may include an actuator 142g and a switching bar 144g, 146g. The switching bar 144g, 146g may be connected to the lower end of the resilient connecting member 120f. In example embodiments, the resilient connecting member 120f may have an upper end fixed to the first connecting pin 130, and a lower end configured to make contact with the second connecting pin 132.

The actuator 142g may raise the switching bar 144g, 146g to downwardly compress the resilient connecting member 120f. Therefore, as shown in FIG. 16, the lower end of the resilient connecting member 120f may be disconnected from the second connecting pin 132. As a result, the test current may not be supplied to the probing head 220.

In contrast, when the actuator 142g is stopped, the tensile resilient connecting member 120f may be tensed and returned to an original position. Thus, the lower end of the resilient connecting member 120f may be connected to the second connecting pin 132 so that the test current may be supplied to the probing head 220 through the PCB 210 and the pogo pin 100g.

Figure 17:
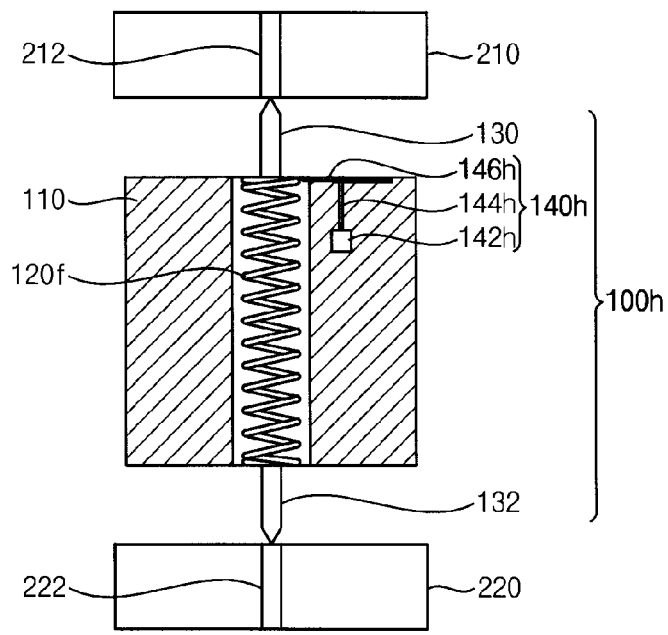
Figure 18:
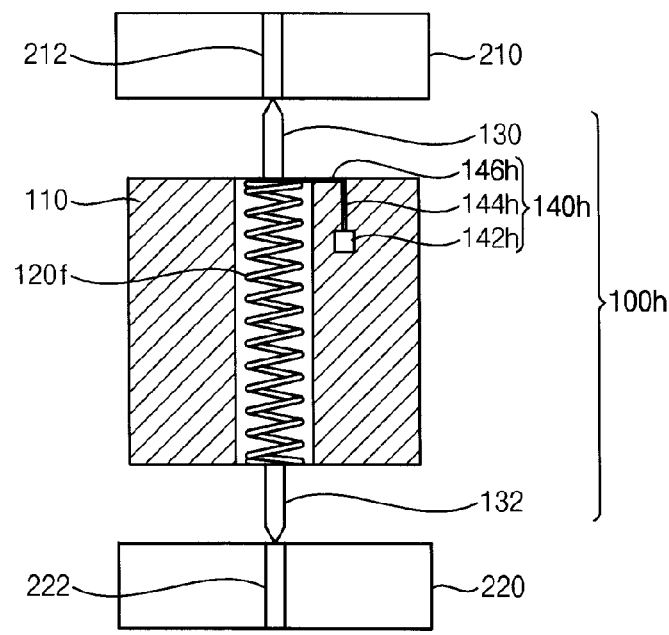

FIGS. 17 and 18 are cross-sectional views illustrating a pogo pin in accordance with example embodiments.

A pogo pin 100h of this example embodiment may include elements substantially the same as those of the pogo pin 100f in FIG. 13 except for a switching unit. Thus, the same reference numerals may refer to the same elements and any further illustrations with respect to the same elements may be omitted herein for brevity.

Referring to FIG. 17, a switching unit 140h of this example embodiment may include an actuator 142h, a switching rod 144h and an insulating plate 146g. The actuator 142h may be positioned in the sidewall of the housing 110. The switching rod 144h may be connected to the actuator 142h. The insulating plate 146h may be connected to the switching rod 144h. The insulating plate 146h may be positioned adjacent to the upper end of the resilient connecting member 120f.

The actuator 142h may move the switching rod 144h, which causes the insulating plate 146h to be horizontally moved into and out of the housing 110. The insulating plate 146h may be interposed between the resilient connecting member 120f and the first connecting pin 130.

Therefore, as shown in FIG. 18, the insulating plate 146h may act as to electrically disconnect the resilient connecting member 120f from the first connecting pin 130. The PCB 210 may be disconnected from the probing head 220 so that the test current flowing through the circuit pattern 212 of the PCB 210 is cut off by the pogo pin 100h. As a result, the test current is not supplied to the probing head 220.

In contrast, when the actuator 142h is reversely operated, the insulating plate 146h may be returned to an original position. Thus, the tensile resilient connecting member 120f may be connected to the first connecting pin 130 so that the test current is supplied to the probing head 220 through the PCB 210 and the pogo pin 100h.

Figure 19:
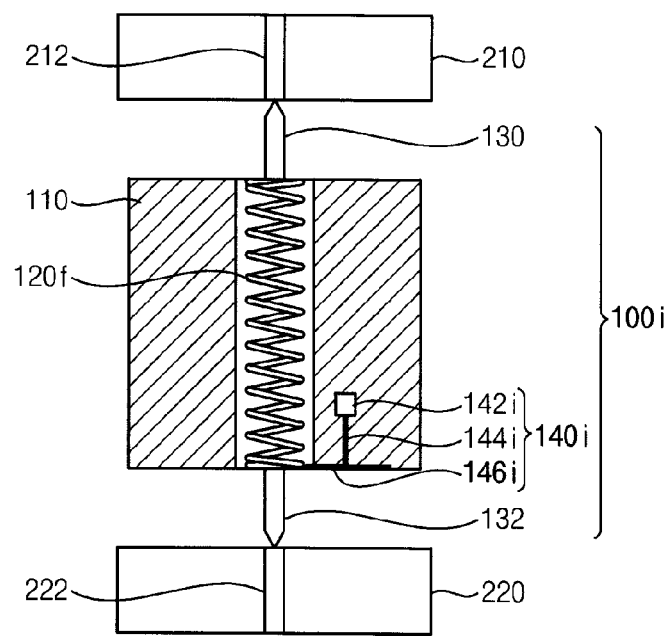
Figure 20:
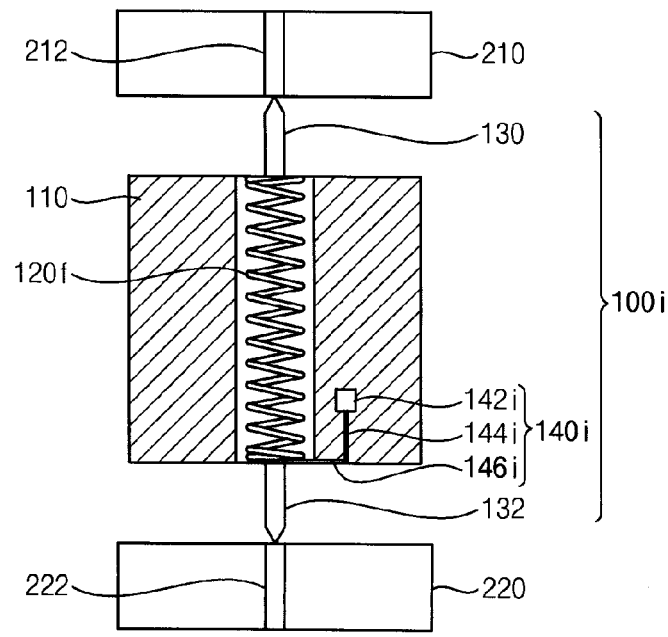

FIGS. 19 and 20 are cross-sectional views illustrating a pogo pin in accordance with example embodiments.

A pogo pin 100i of this example embodiment may include elements substantially the same as those of the pogo pin 100h in FIG. 17 except for a switching unit. Thus, the same reference numerals may refer to the same elements and any further illustrations with respect to the same elements may be omitted herein for brevity.

Referring to FIG. 19, a switching unit 140i of this example embodiment may include an actuator 142i, a switching rod 144i and an insulating plate 146i. The actuator 142i may be positioned in the sidewall of the housing 110. The switching rod 144i may be connected to the actuator 142i. The insulating plate 146i may be connected to the switching rod 144i. The insulating plate 146i may be positioned adjacent to the lower end of the resilient connecting member 120f.

The actuator 142i may move the switching rod 144i, which causes the insulating plate 146i to be horizontally moved into and out of the housing 110. The insulating plate 146i may be interposed between the resilient connecting member 120f and the second connecting pin 132.

Therefore, as shown in FIG. 20, the insulating plate 146i may act as to electrically disconnect the resilient connecting member 120f from the second connecting pin 132. The PCB 210 may be disconnected from the probing head 220 so that the test current flowing through the circuit pattern 212 of the PCB 210 is cut off by the pogo pin 100i. As a result, the test current is not supplied to the probing head 220.

In contrast, when the actuator 142i is reversely operated, the insulating plate 146i may be returned to an original position. Thus, the tensile resilient connecting member 120f may be connected to the second connecting pin 132 so that the test current is supplied to the probing head 220 through the PCB 210 and the pogo pin 100i.

Figure 21:
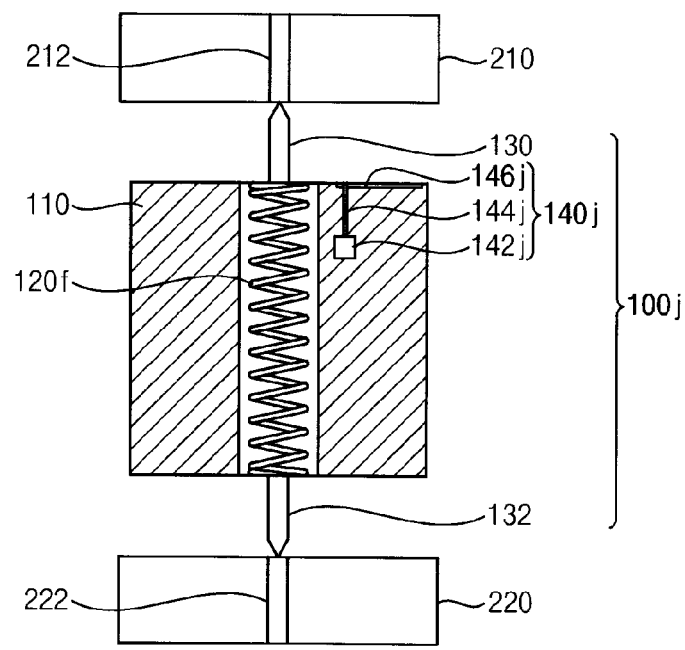
Figure 22:
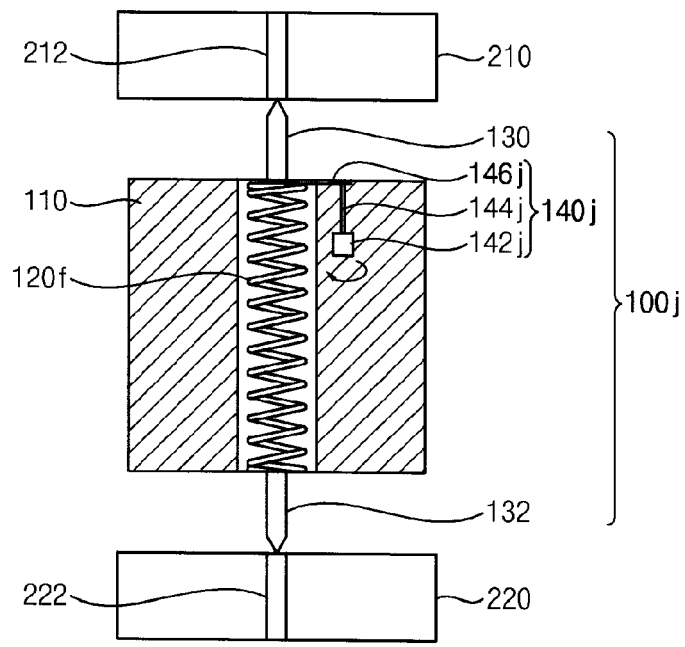

FIGS. 21 and 22 are cross-sectional views illustrating a pogo pin in accordance with example embodiments.

A pogo pin 100j of this example embodiment may include elements substantially the same as those of the pogo pin 100i in FIG. 19 except for a switching unit. Thus, the same reference numerals may refer to the same elements and any further illustrations with respect to the same elements may be omitted herein for brevity.

Referring to FIG. 21, a switching unit 140j of this example embodiment may include an actuator 142j, a switching rod 144j and an insulating plate 146j. The actuator 142j may be positioned in the sidewall of the housing 110. The switching rod 144j may be connected to the actuator 142j. Further, the switching rod 144j may be connected to an eccentric portion of the insulating plate 146j. The insulating plate 146j may be positioned adjacent to the upper end of the resilient connecting member 120f.

The actuator 142j may rotate the switching rod 144h into the housing 110. The insulating plate 146j may be rotated into the housing 110. The insulating plate 146j may be interposed between the resilient connecting member 120f and the first connecting pin 130.

Therefore, as shown in FIG. 22, the insulating plate 146j may act to electrically disconnect the resilient connecting member 120f from the first connecting pin 130. The PCB 210 may be disconnected from the probing head 220 so that the test current flowing through the circuit pattern 212 of the PCB 210 is cut off by the pogo pin 100j. As a result, the test current may not be supplied to the probing head 220.

In contrast, when the actuator 142j is reversely operated, the insulating plate 146j may be returned to an original position. Thus, the tensile resilient connecting member 120f may be connected to the first connecting pin 130 so that the test current is supplied to the probing head 220 through the PCB 210 and the pogo pin 100j.

Figure 23:
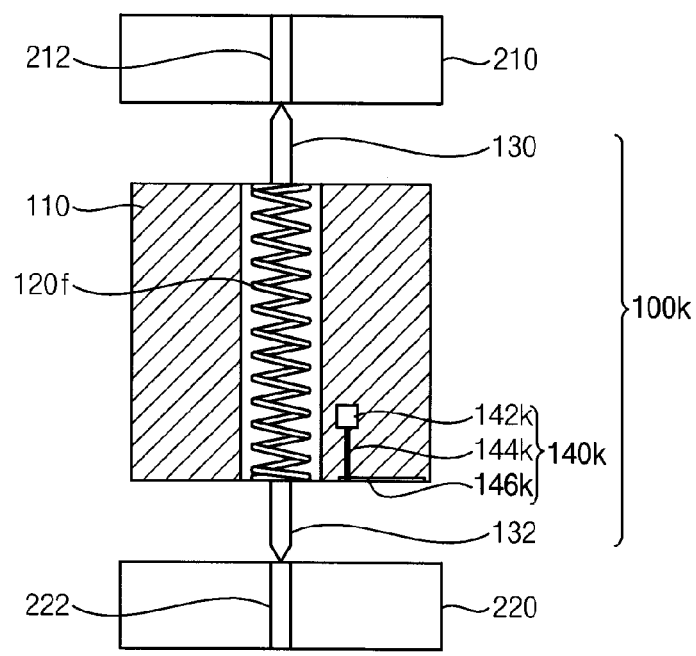
Figure 24:
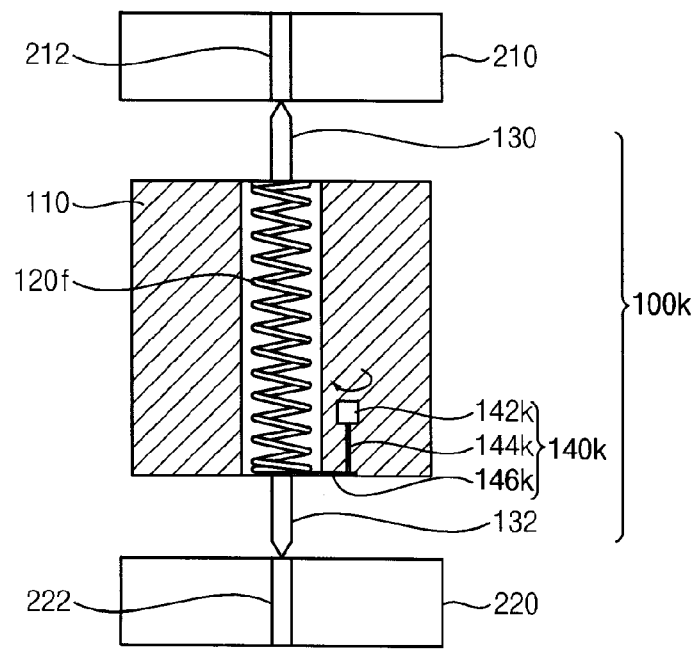

FIGS. 23 and 24 are cross-sectional views illustrating a pogo pin in accordance with example embodiments.

A pogo pin 100k of this example embodiment may include elements substantially the same as those of the pogo pin 100j in FIG. 21 except for a switching unit. Thus, the same reference numerals may refer to the same elements and any further illustrations with respect to the same elements may be omitted herein for brevity.

Referring to FIG. 23, a switching unit 140k of this example embodiment may include an actuator 142k, a switching rod 144k and an insulating plate 146k. The actuator 142k may be positioned in the sidewall of the housing 110. The switching rod 144k may be connected to the actuator 142k. Further, the switching rod 144k may be connected to an eccentric portion of the insulating plate 146k. The insulating plate 146k may be positioned adjacent to the lower end of the resilient connecting member 120f.

The actuator 142k may rotate the switching rod 144k into the housing 110. The insulating plate 146k may be rotated into the housing 110. The insulating plate 146k may be interposed between the resilient connecting member 120f and the second connecting pin 132.

Therefore, as shown in FIG. 24, the insulating plate 146k may act to electrically disconnect the resilient connecting member 120f from the second connecting pin 132. The PCB 210 may be disconnected from the probing head 220 so that the test current flowing through the circuit pattern 212 of the PCB 210 is cut off by the pogo pin 100k. As a result, the test current is not supplied to the probing head 220.

In contrast, when the actuator 142k is reversely operated, the insulating plate 146k may be returned to an original position. Thus, the tensile resilient connecting member 120f may be connected to the second connecting pin 132 so that the test current is supplied to the probing head 220 through the PCB 210 and the pogo pin 100k.

Figure 25:
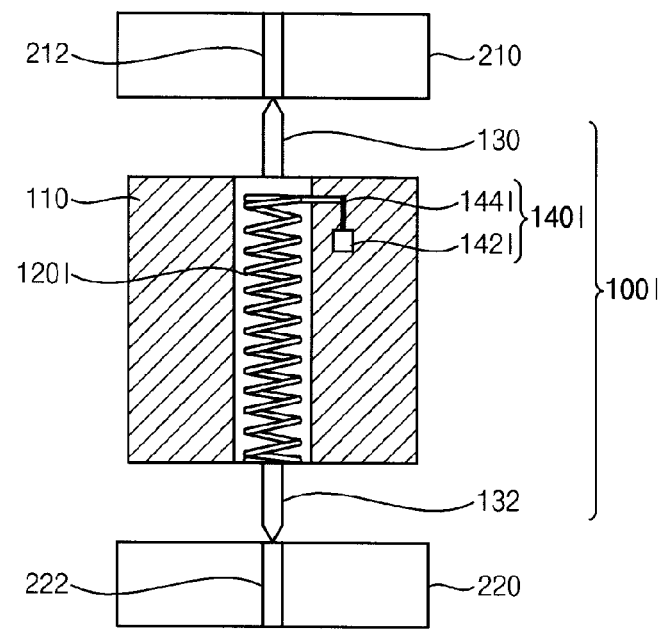
Figure 26:
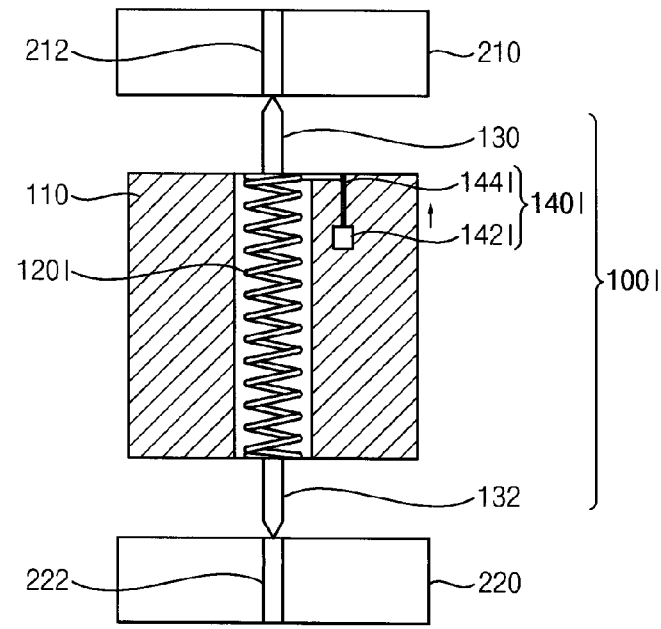

FIGS. 25 and 26 are cross-sectional views illustrating a pogo pin in accordance with example embodiments.

A pogo pin 100l of this example embodiment may include elements substantially the same as those of the pogo pin 100f in FIG. 13 except for a resilient connecting member and a switching unit. Thus, the same reference numerals may refer to the same elements and any further illustrations with respect to the same elements may be omitted herein for brevity.

Referring to FIGS. 25 and 26, a resilient connecting member 120l of this example embodiment may include a single compressive spring. Thus, when a force is not applied to the resilient connecting member 120l, the resilient connecting member 120l may be disconnected from the first connecting pin 130.

A switching unit 140l of this example embodiment may include an actuator 142l and a switching rod 144l. The switching rod 144l may be connected to the upper end of the resilient connecting member 120l. The actuator 142l may raise the switching rod 144l to tense the resilient connecting member 120l. Therefore, the tensed resilient connecting member 120l may be connected to the first connecting pin 130. As a result, the test current may be supplied to the probing head 220 through the PCB 210 and the pogo pin 100l.

In contrast, when the actuator 142l is stopped, the compressive resilient connecting member 120l may be compressed and returned to an original position. Thus, the resilient connecting member 120l may be disconnected from the first connecting pin 130 so that the test current is not supplied to the probing head 220.

Figure 27:
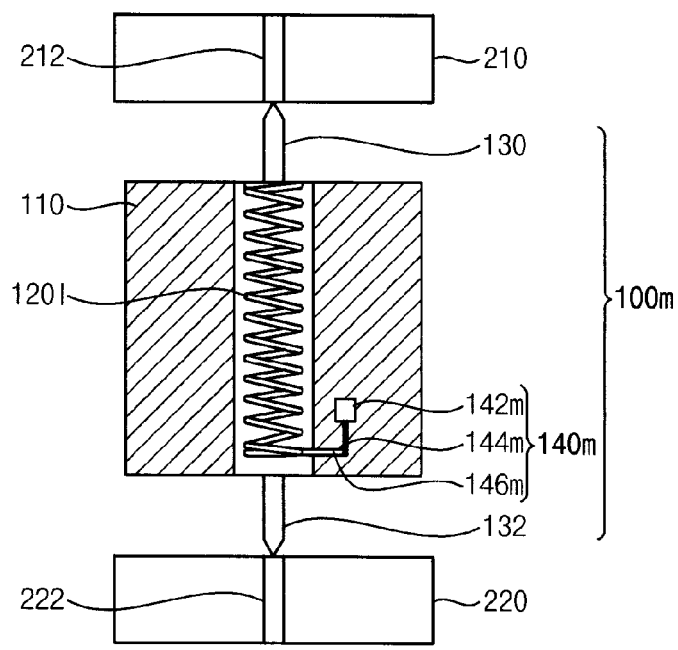
Figure 28:
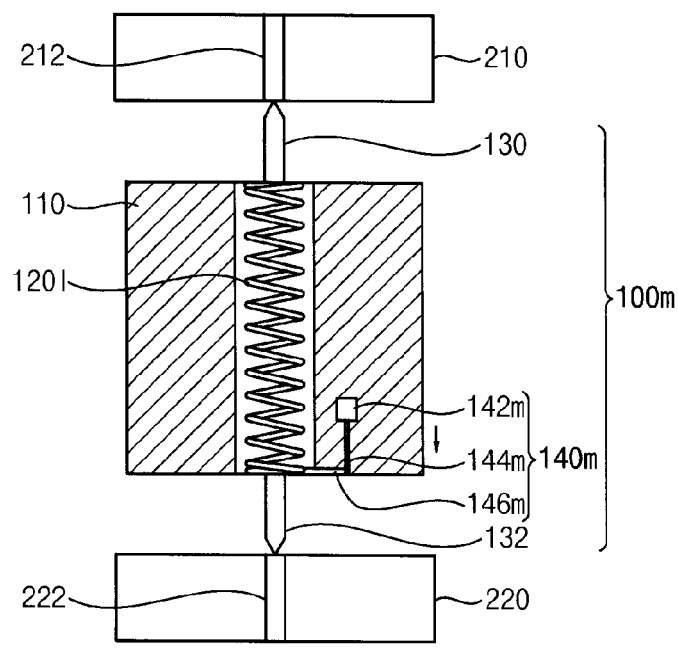

FIGS. 27 and 28 are cross-sectional views illustrating a pogo pin in accordance with example embodiments.

A pogo pin 100m of this example embodiment may include elements substantially the same as those of the pogo pin 100l in FIG. 25 except for a switching unit. Thus, the same reference numerals may refer to the same elements and any further illustrations with respect to the same elements may be omitted herein for brevity.

Referring to FIG. 27, a switching unit 140m of this example embodiment may include an actuator 142m and a switching bar 144m, 146m. The switching bar 144m, 146m may be connected to the lower end of the resilient connecting member 120l. The actuator 142m may descend the switching bar 144m, 146m to tense the resilient connecting member 120l. Therefore, the tensed resilient connecting member 120l may be connected to the second connecting pin 132. As a result, the test current is supplied to the probing head 220 through the PCB 210 and the pogo pin 100m.

In contrast, when the actuator 142m is stopped, the compressive resilient connecting member 120l may be compressed and returned to an original position. Thus, the resilient connecting member 120l may be disconnected from the second connecting pin 132 so that the test current is not supplied to the probing head 220.

Figure 29:
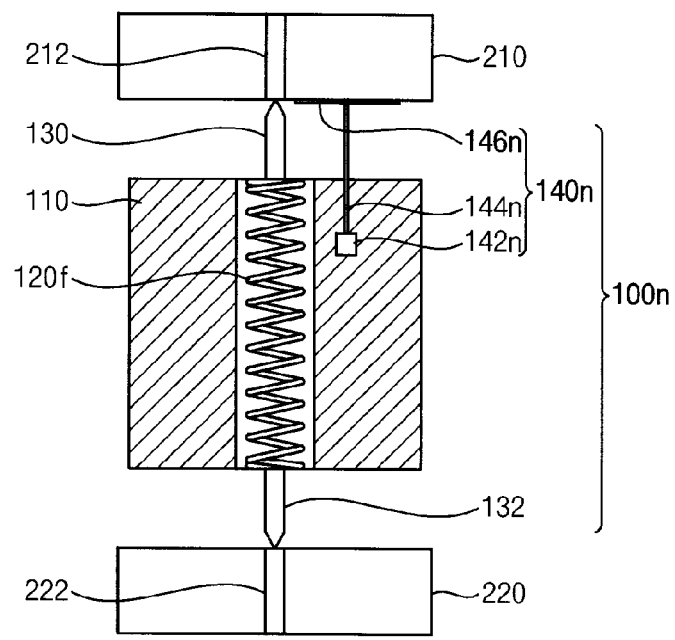
Figure 30:
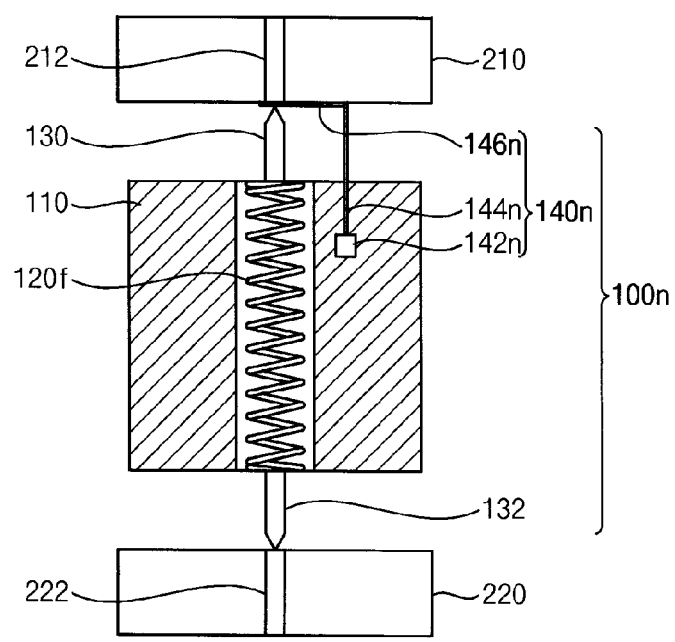

FIGS. 29 and 30 are cross-sectional views illustrating a pogo pin in accordance with example embodiments.

A pogo pin 100n of this example embodiment may include elements substantially the same as those of the pogo pin 100h in FIG. 17 except for a switching unit. Thus, the same reference numerals may refer to the same elements and any further illustrations with respect to the same elements may be omitted herein for brevity.

Referring to FIG. 29, a switching unit 140n of this example embodiment includes an actuator 142n, a switching rod 144n and an insulating plate 146n. The actuator 142n may be positioned in the sidewall of the housing 110. The switching rod 144n may be extended from the actuator 142n toward the PCB 210. The insulating plate 146n may be connected to the switching rod 144n. The insulating plate 146n may be positioned adjacent to the first connecting pin 130 and the PCB 210.

The actuator 142n may move the switching rod 144n, causing the insulating plate 146n to be interposed between the PCB 210 and the first connecting pin 130.

Therefore, as shown in FIG. 30, the insulating plate 146n may act to electrically disconnect the PCB 210 from the first connecting pin 130. The PCB 210 may be disconnected from the probing head 220 so that the test current flowing through the circuit pattern 212 of the PCB 210 is cut off by the pogo pin 100n. As a result, the test current is not supplied to the probing head 220.

In contrast, when the actuator 142n is reversely operated, the insulating plate 146n may be returned to an original position. Thus, the first connecting pin 130 may be connected to the PCB 210 so that the test current is supplied to the probing head 220 through the PCB 210 and the pogo pin 100n.

Figure 31:
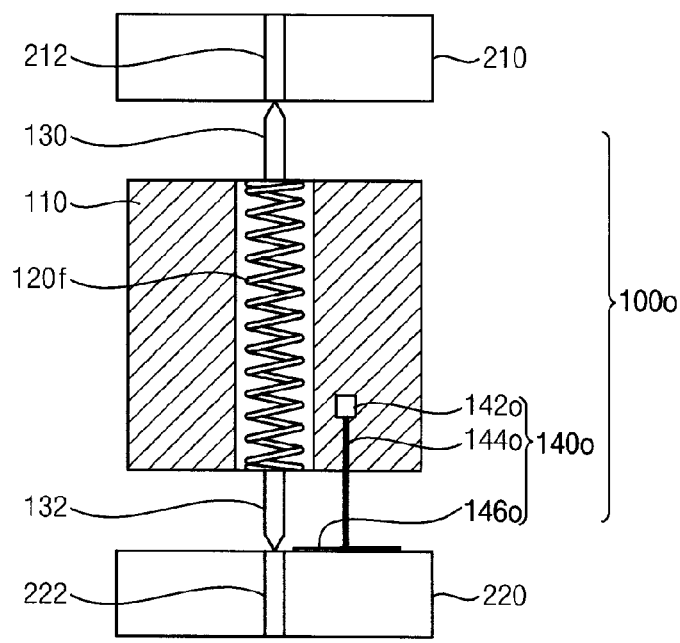
Figure 32:
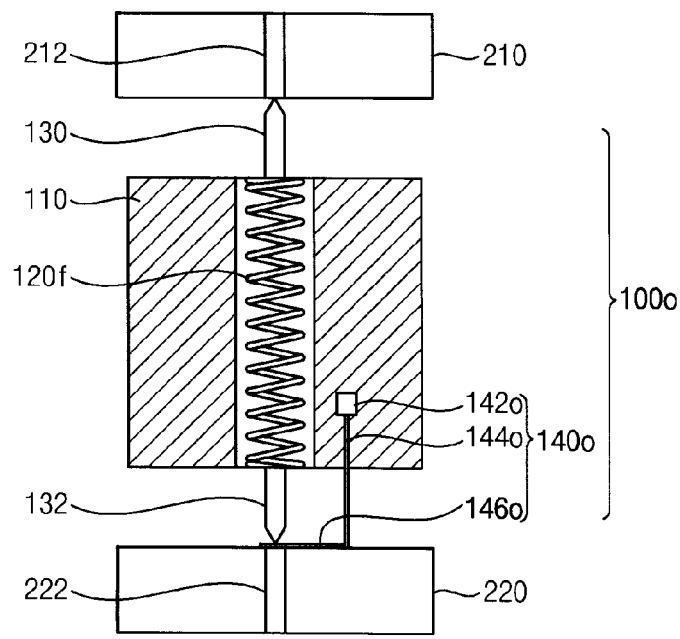

FIGS. 31 and 32 are cross-sectional views illustrating a pogo pin in accordance with example embodiments.

A pogo pin 100o of this example embodiment may include elements substantially the same as those of the pogo pin 100n in FIG. 29 except for a switching unit. Thus, the same reference numerals may refer to the same elements and any further illustrations with respect to the same elements may be omitted herein for brevity.

Referring to FIG. 31, a switching unit 140o of this example embodiment may include an actuator 142o, a switching rod 144o and an insulating plate 146o. The actuator 142o may be positioned in the sidewall of the housing 110. The switching rod 144o may be extended from the actuator 142o toward the probing head 220. The insulating plate 146o may be connected to the switching rod 144o. The insulating plate 146o may be positioned adjacent to the second connecting pin 132 and the probing head 220.

The actuator 142o may move the switching rod 144o, causing the insulating plate 146o to be interposed between the probing head 220 and the second connecting pin 132.

Therefore, as shown in FIG. 32, the insulating plate 146o may act to electrically disconnect the probing head 220 from the second connecting pin 132. The PCB 210 may be disconnected from the probing head 220 so that the test current flowing through the circuit pattern 212 of the PCB 210 is cut off by the pogo pin 100o. As a result, the test current is not supplied to the probing head 220.

In contrast, when the actuator 142o is reversely operated, the insulating plate 146o may be returned to an original position. Thus, the second connecting pin 132 may be connected to the test pattern 222 of the probing head 220 so that the test current may be supplied to the probing head 220 through the PCB 210 and the pogo pin 100o.

Figure 33:
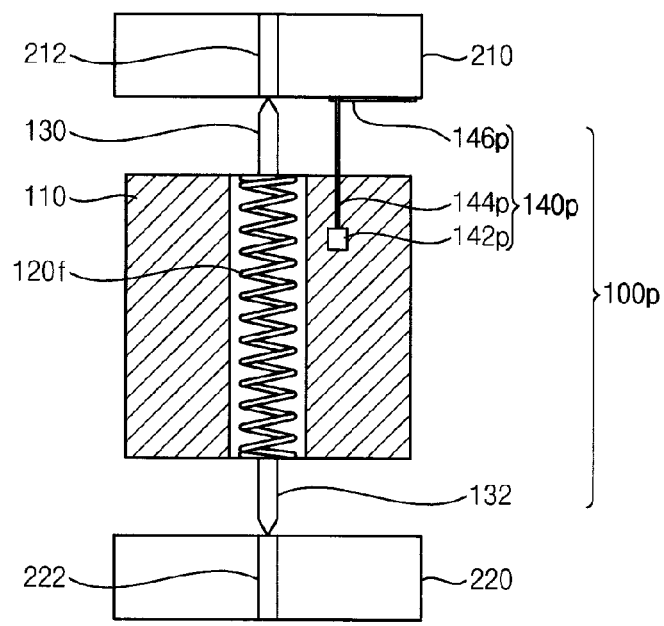
Figure 34:
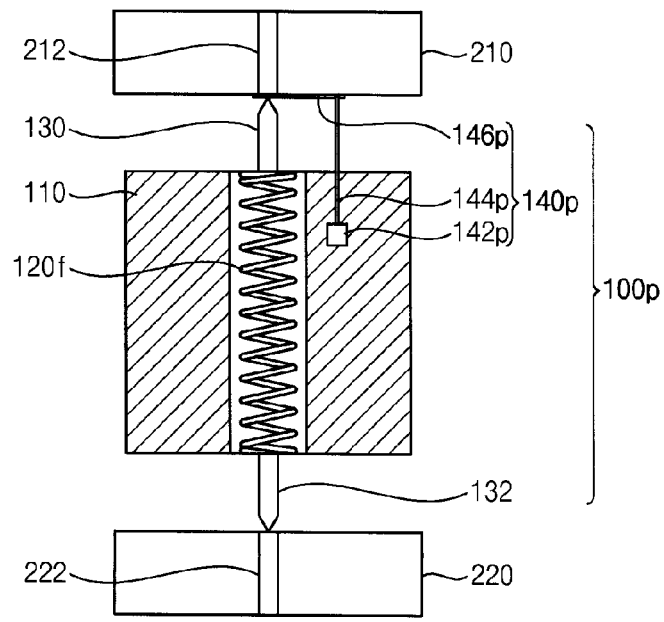

FIGS. 33 and 34 are cross-sectional views illustrating a pogo pin in accordance with example embodiments.

A pogo pin 100p of this example embodiment may include elements substantially the same as those of the pogo pin 100n in FIG. 29 except for a switching unit. Thus, the same reference numerals may refer to the same elements and any further illustrations with respect to the same elements may be omitted herein for brevity.

Referring to FIG. 33, a switching unit 140p of this example embodiment may include an actuator 142p, a switching rod 144p and an insulating plate 146p. The actuator 142p may be positioned in the sidewall of the housing 110. The switching rod 144p may be extended from the actuator 142p toward the PCB 210. The insulating plate 146p may be connected to an eccentric portion of the switching rod 144p. The insulating plate 146p may be positioned adjacent to the first connecting pin 130 and the PCB 210.

The actuator 142p may rotate the switching rod 144p. The insulating plate 146p may be interposed between the PCB 210 and the first connecting pin 130.

Therefore, as shown in FIG. 34, the insulating plate 146p may act to electrically disconnect the PCB 210 from the first connecting pin 130. The PCB 210 may be disconnected from the probing head 220 so that the test current flowing through the circuit pattern 212 of the PCB 210 is cut off by the pogo pin 100p. As a result, the test current is not supplied to the probing head 220.

In contrast, when the actuator 142p is reversely operated, the insulating plate 146p may be returned to an original position. Thus, the first connecting pin 130 may be connected to the PCB 210 so that the test current may be supplied to the probing head 220 through the PCB 210 and the pogo pin 100p.

Figure 35:
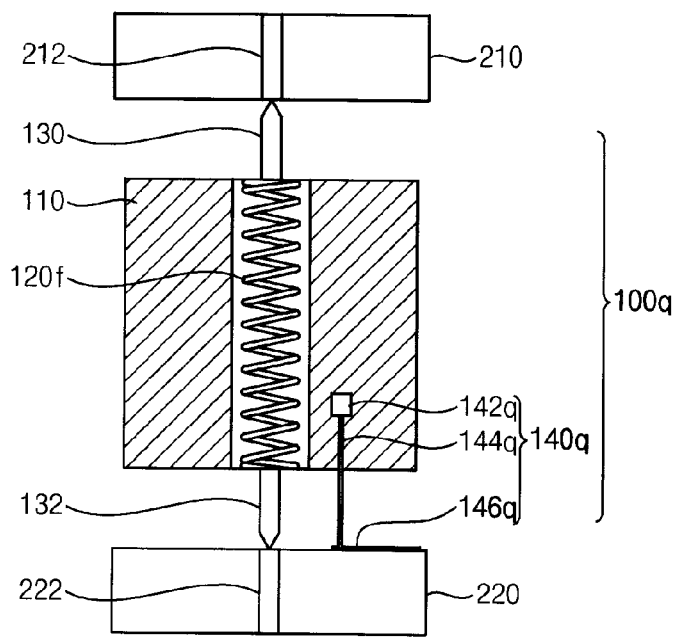
Figure 36:
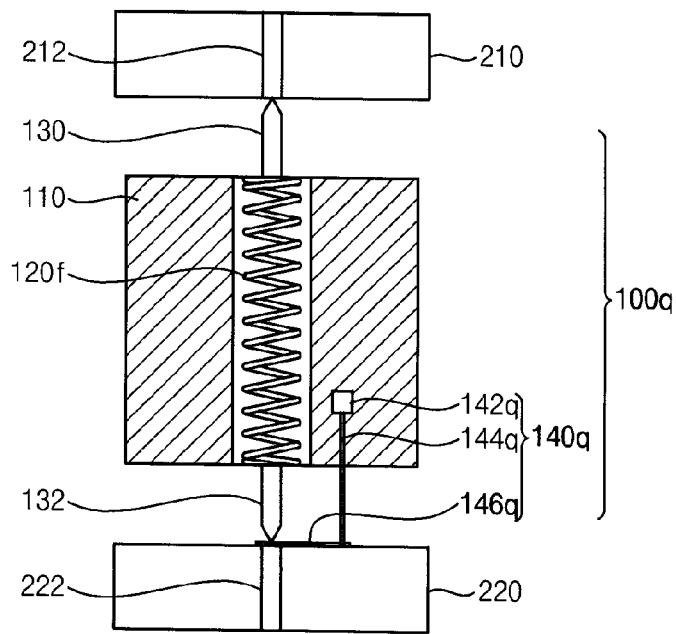

FIGS. 35 and 36 are cross-sectional views illustrating a pogo pin in accordance with example embodiments.

A pogo pin 100q of this example embodiment may include elements substantially the same as those of the pogo pin 100o in FIG. 31 except for a switching unit. Thus, the same reference numerals may refer to the same elements and any further illustrations with respect to the same elements may be omitted herein for brevity.

Referring to FIG. 35, a switching unit 140q of this example embodiment may include an actuator 142q, a switching rod 144q and an insulating plate 146q. The actuator 142q may be positioned in the sidewall of the housing 110. The switching rod 144q may be extended from the actuator 142q toward the probing head 220. The switching rod 144q may be connected to an eccentric portion of the insulating plate 146q. The insulating plate 146q may be positioned adjacent to the second connecting pin 132 and the probing head 220.

The actuator 142q may rotate the switching rod 144q. The insulating plate 146q may be interposed between the probing head 220 and the second connecting pin 132.

Therefore, as shown in FIG. 36, the insulating plate 146q may act to electrically disconnect the probing head 220 from the second connecting pin 132. The PCB 210 may be disconnected from the probing head 220 so that the test current flowing through the circuit pattern 212 of the PCB 210 is cut off by the pogo pin 100q. As a result, the test current may not be supplied to the probing head 220.

In contrast, when the actuator 142q is reversely operated, the insulating plate 146q may be returned to an original position. Thus, the second connecting pin 132 may be connected to the test pattern 222 of the probing head 220 210 so that the test current may be supplied to the probing head 220 through the PCB 210 and the pogo pin 100q.

In example embodiments, the switching units of the pogo pins may include the mechanical structure such as described herein. Alternatively, the switching units of the pogo pins may perform the switching operations using other means, such as an electromagnetic force.

Probe Card

Figure 37:
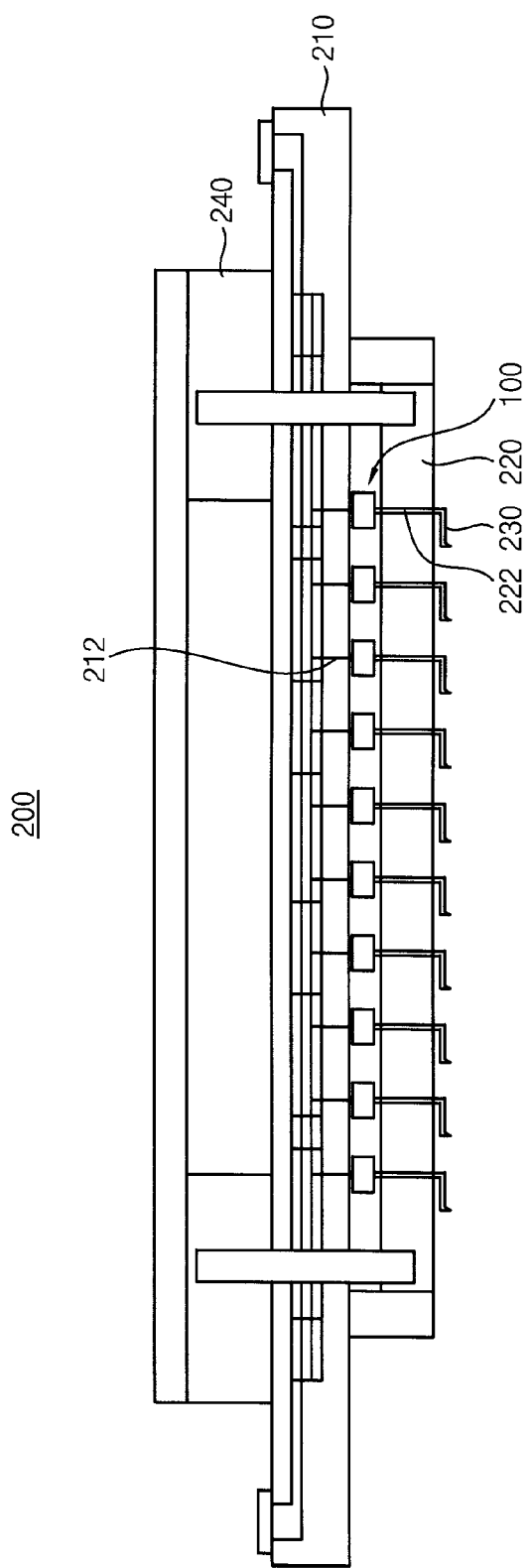

FIG. 37 is a cross-sectional view illustrating a probe card including the pogo pin such as described above in FIGS. 1-36, according to certain embodiments.

Referring to FIG. 37, a probe card 200 of this example embodiment may include a PCB 210, a probing head 220, a plurality of needles 230, the pogo pins 100 and a stiffener 240.

The PCB 210 may include a circuit pattern 212. The test current may flow through the circuit pattern 212.

The probing head 220 may be arranged under the PCB 210. The probing head 220 may include a test pattern (e.g., circuit) through which the test current may flow. In example embodiments, the probing head 220 may include a multi-layered substrate.

The pogo pins 100 may be arranged between the PCB 210 and the probing head 220. The pogo pins 100 may selectively connect the circuit pattern 212 of the PCB with the test pattern 222 of the probing head 220. The pogo pins may also provide as a shock absorber to reduce the stress on an object being tested, and as a means for ensuring that all connection elements on the object being tested are contacted by needles of the test probe. In example embodiments, the pogo pin 100 may include elements substantially the same as those of the pogo pin in any one of FIGS. 1 to 36.

For example, the probe card 200 may include the pogo pin 100a in FIG. 3, the pogo pin 100b in FIG. 5, the pogo pin 100c in FIG. 7, the pogo pin 100d in FIG. 9, the pogo pin 100e in FIG. 11, the pogo pin 100f in FIG. 13, the pogo pin 100g in FIG. 15, the pogo pin 100h in FIG. 17, the pogo pin 100i in FIG. 19, the pogo pin 100j in FIG. 21, the pogo pin 100k in FIG. 23, the pogo pin 100l in FIG. 25, the pogo pin 100m in FIG. 27, the pogo pin 100n in FIG. 29, the pogo pin 100o in FIG. 31, the pogo pin 100p in FIG. 33 or the pogo pin 100q in FIG. 35.

Thus, any further illustrations with respect to the pogo pin 100 are omitted herein for brevity.

The needles 230 may be arranged a lower surface of the probing head 220. The needles 230 may be configured to make contact with an object. The stiffener 240 may firmly support the PCB 210 and the probing head 220.

The pogo pins 100 may individually connect the needles 230 with the circuit pattern 212 of the PCB 210. Because each of the pogo pins 100 may include the switching unit 140, the test current supplied to the needles 230 may be individually controlled by the switching unit 140.

According to example embodiments, the switching unit in the housing may selectively cut off an electrical connection between the PCB and the probing head. Thus, because the PCB does not require additional switching circuitry or substrates, the PCB may have a small size so that the probe card may also have a small size. Further, the PCB may have a simple structure so that the PCB may be manufactured by a low cost. Particularly, the switching operations may be performed in the pogo pin adjacent to the object so that noise may not be generated in the test current supplied to the object.

The object being tested may be, for example, a semiconductor device such as a semiconductor chip. The semiconductor chip may be part of a wafer. Furthermore, the semiconductor chip may be part of a stack of chips being tested.

Figure 38:
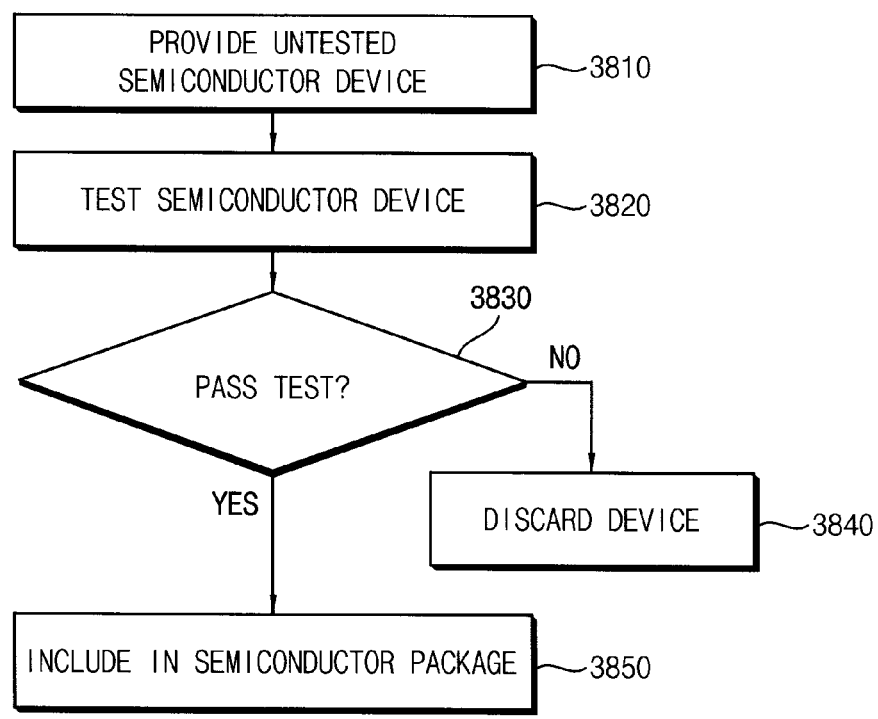
FIG. 38 is a flow chart illustrating an exemplary method of manufacturing a semiconductor device using a probe card, according to certain embodiments.

FIG. 38 depicts an exemplary method 3800 of manufacturing a semiconductor device using a probe card, according to certain embodiments.

The method 3800 may use the probe card having one of the pogo pins such as described above. In one embodiment, method 3800 includes a first step 3810 of providing an untested semiconductor device. For example, a semiconductor chip may be provided on a wafer, or a stack of semiconductor chips may be provided as a stack of wafers. The chips may be, for example, memory chips or logic chips. These chips may be formed using known processes for forming integrated circuits and other chip elements on the wafer. Individual chips or stacked chips may be provided as well. In step 3820, the semiconductor device is tested. For example, the semiconductor device may be tested by lowering the probe card to the semiconductor device so that the needles of the probe card contact pads on the semiconductor device, and then sending signals to the device from a tester based on controlled connections of pogo pins in the probe card such as discussed above. Certain pogo pins may form electrical connections between the tester and/or the PCB of the probe card and the semiconductor device, and other pogo pins may prevent electrical connections between the tester and/or PCB of the probe card and the semiconductor device.

In step 3830, it is determined whether a tested semiconductor device passes the test (e.g., is working according to specifications). If not, it may be discarded (step 3840). Alternately, it may be reused or otherwise fixed. If it passes, the device may be included in a semiconductor package (step 3850). For example, if a wafer or stack of wafers was being tested, after testing, the individual chips or individual chip stacks may be singulated, and chips or chip stacks that pass the test may be included in a semiconductor package (e.g., may be stacked on a package substrate, and covered by a mold such as a protective resin). If individual chips or chip stacks were being tested, then after testing, the individual chips or individual chip stacks that pass the test may be included in a semiconductor package.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A probe card comprising:
   a printed circuit board (PCB) having a circuit pattern through which a test current passes;
   a probing head arranged under the PCB, the probing head including circuitry through which the test current passes;
   a plurality of needles provided to the probing head to supply the test current to an object; and
   a plurality of pogo pins positioned between the PCB and the probing head, each pogo pin including a housing arranged between the PCB and the probing head, a resilient connecting member arranged in the housing to electrically connect the PCB with the probing head, and a switching unit provided in the housing to selectively cut off an electrical connection between the PCB and the probing head,
   wherein the resilient connecting member comprises a first spring electrically connected to the PCB, and a second spring electrically connected to the probing head, and
   wherein the switching unit is configured to move any one of the first spring and the second spring to selectively disconnect the first spring from the second spring.

2. The probe card of claim 1, further comprising, for each pogo pin:
   a first connecting pin at a first end of the resilient connecting member; and
   a second connecting pin at a second, opposite end of the resilient connecting member,
   wherein the switching unit electrically disconnects the first connecting pin from the second connecting pin.

3. The probe card of claim 2, wherein:
   the switching unit includes an actuator connected to any one of the first spring and the second spring, the actuator configured to move any one of the first spring and the second spring so as to electrically disconnect the first connecting pin from the second connecting pin.

4. A pogo pin connected to a printed circuit board (PCB) and a probing head of a probe card and positioned to pass signals between circuitry of the PCB and circuitry of the probing head, the pogo pin comprising:
   a housing arranged between the PCB and the probing head;
   at least a first spring arranged to electrically connect and disconnect the PCB and the probing head;
   at least a first connecting pin between the first spring and the PCB;
   at least a second connecting pin between the first spring and the probing head; and
   an actuator and disconnecting member arranged to selectively electrically connect and disconnect one of the first pin and the second pin from the first spring.

5. The pogo pin of claim 4, wherein the disconnecting member includes one of a raising/lowering element to raise and lower the first spring, and an insulating member that electrically disconnects the first pin or second pin from the first spring.

6. A pogo pin comprising:
a housing arranged between a printed circuit board (PCB) and a probing head of a probe card;
a resilient connecting member arranged in the housing to electrically connect the PCB with the probing head; and
a switching unit provided in the housing to selectively cut off an electrical connection between the PCB and the probing head,
wherein the resilient connecting member comprises a first spring electrically connected to the PCB, and a second spring electrically connected to the probing head, and
wherein the switching unit is configured to move any one of the first spring and the second spring to selectively disconnect the first spring from the second spring.

7. The pogo pin of claim 6, wherein the first spring and the second spring comprise a tensile spring.

8. The pogo pin of claim 7, wherein the switching unit comprises:
a switching rod connected to the first spring; and
an actuator configured to move the switching rod to disconnect the first spring from the second spring.

9. The pogo pin of claim 7, wherein the switching unit comprises:
an insulating plate selectively interposed between the first spring and the second spring; and
an actuator configured to selectively move the insulating plate between the first spring and the second spring.

10. The pogo pin of claim 6, wherein the first spring and the second spring comprise a compressive spring.

11. The pogo pin of claim 10, wherein the switching unit comprises:
a switching rod connected to the first spring; and
an actuator configured to move the switching rod to connect the first spring with the second spring.

12. The pogo pin of claim 6, wherein the switching unit comprises:
a switching rod connected to the resilient connecting member; and
an actuator configured to move the switching rod to electrically connect and disconnect at least a portion of the resilient connecting member from the PCB.

13. The pogo pin of claim 6, further comprising:
a first connecting pin arranged between the housing and the PCB to electrically connect the resilient connecting member with the PCB; and
a second connecting pin arranged between the housing and the probing head to electrically connect the resilient connecting member with the probing head.

14. The pogo pin of claim 13, wherein the switching unit comprises:
an insulating plate selectively interposed between the first connecting pin and the PCB; and
an actuator configured to selectively move the insulating plate between the first connecting pin and the PCB.

15. The pogo pin of claim 13, wherein the switching unit comprises:
an insulating plate selectively interposed between the second connecting pin and the probing head; and
an actuator configured to selectively move the insulating plate between the second connecting pin and the probing head.

* * * * *